(12) United States Patent
Rasheed et al.

(10) Patent No.: US 11,562,914 B2
(45) Date of Patent: Jan. 24, 2023

(54) HEATER COVER PLATE FOR UNIFORMITY IMPROVEMENT

(71) Applicant: Applied Materials, Inc., Santa Clara, CA (US)

(72) Inventors: Muhammad M. Rasheed, San Jose, CA (US); Ilker Durukan, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/227,453

(22) Filed: Apr. 12, 2021

(65) Prior Publication Data

US 2021/0343557 A1 Nov. 4, 2021

Related U.S. Application Data

(60) Provisional application No. 63/017,381, filed on Apr. 29, 2020.

(51) Int. Cl.
*B23Q 3/15* (2006.01)
*H01L 21/67* (2006.01)
*H01L 21/687* (2006.01)

(52) U.S. Cl.
CPC .. *H01L 21/67103* (2013.01); *H01L 21/68742* (2013.01)

(58) Field of Classification Search
CPC ......... H01L 21/67103; H01L 21/68742; H01L 21/682; H01L 21/68; H01L 21/6875; H01L 21/68714; H01L 21/683; H01L 21/68735; H01L 21/3065; H01L 21/6833; B23Q 3/15; B23Q 3/154
See application file for complete search history.

(56) References Cited

U.S. PATENT DOCUMENTS

| 6,189,482 | B1 | 2/2001 | Zhao et al. |
| 6,223,447 | B1 * | 5/2001 | Yudovsky ......... H01L 21/68735 |
| | | | 118/728 |
| 6,669,783 | B2 | 12/2003 | Sexton et al. |
| 7,589,950 | B2 | 9/2009 | Parkhe et al. |

(Continued)

FOREIGN PATENT DOCUMENTS

| JP | 2002-083801 A | | 3/2002 |
| JP | 2002083801 A | * | 3/2002 |

(Continued)

OTHER PUBLICATIONS

International Search Report and Written Opinion dated Jul. 21, 2021 for Application No. PCT/US2021/026686.

(Continued)

*Primary Examiner* — Gregory A Wilson
(74) *Attorney, Agent, or Firm* — Patterson + Sheridan, LLP

(57) ABSTRACT

Embodiments of the present disclosure generally relate to an apparatus for improving the film thickness on a substrate when using a heated substrate support. A cover plate to be placed over the top surface of a heated substrate support is disclosed. The cover plate includes a pocket formed in the middle thereof for the placement of a substrate. The cover plate may include a variety of features including a plurality of dimples, a plurality of radially disposed grooves, a plurality of annular grooves, lift pin holes, pin slots, and gas exhaust holes.

18 Claims, 14 Drawing Sheets

(56) References Cited

U.S. PATENT DOCUMENTS

| | | | |
|---|---|---|---|
| 8,851,463 | B2 | 10/2014 | Angelov et al. |
| 9,666,467 | B2 * | 5/2017 | Parkhe ............... H01L 21/67126 |
| 9,892,956 | B1 * | 2/2018 | Konkola ............ H01J 37/32009 |
| 9,905,454 | B2 * | 2/2018 | Ishii .................. H01L 21/67115 |
| 10,256,131 | B2 * | 4/2019 | Kosakai .............. H01L 21/6833 |
| 10,832,931 | B2 * | 11/2020 | Mangalore ........ H01L 21/68785 |
| 10,879,053 | B2 | 12/2020 | Ricci et al. |
| 2011/0222038 | A1 * | 9/2011 | Yamashita ............ C23C 16/511 |
| | | | 355/72 |
| 2013/0286530 | A1 | 10/2013 | Lin et al. |
| 2015/0075432 | A1 | 3/2015 | Tzu et al. |
| 2018/0012785 | A1 * | 1/2018 | Matyushkin ...... H01L 21/67109 |
| 2019/0088517 | A1 | 3/2019 | Kosakai et al. |
| 2019/0177847 | A1 | 6/2019 | Tomizawa et al. |
| 2020/0090973 | A1 * | 3/2020 | Launay ............. H01L 21/67103 |
| 2021/0348272 | A1 * | 11/2021 | Murakami ........ H01L 21/67103 |

FOREIGN PATENT DOCUMENTS

| | | | |
|---|---|---|---|
| JP | 2003-324048 A | 11/2003 | |
| JP | 2007-515805 A | 6/2007 | |
| JP | 2016-184734 | * 10/2016 | |
| JP | 2018-037537 A | 3/2018 | |
| KR | 10-0689843 | 3/2007 | |
| TW | 201703137 A | 1/2017 | |
| WO | WO-2019087977 A1 * | 5/2019 | ............... B23Q 3/15 |

OTHER PUBLICATIONS

Taiwan Office Action dated Dec. 15, 2021 for Application No. 110115115.

Taiwan Office Action dated Apr. 11, 2022 for Application No. 110115115.

* cited by examiner

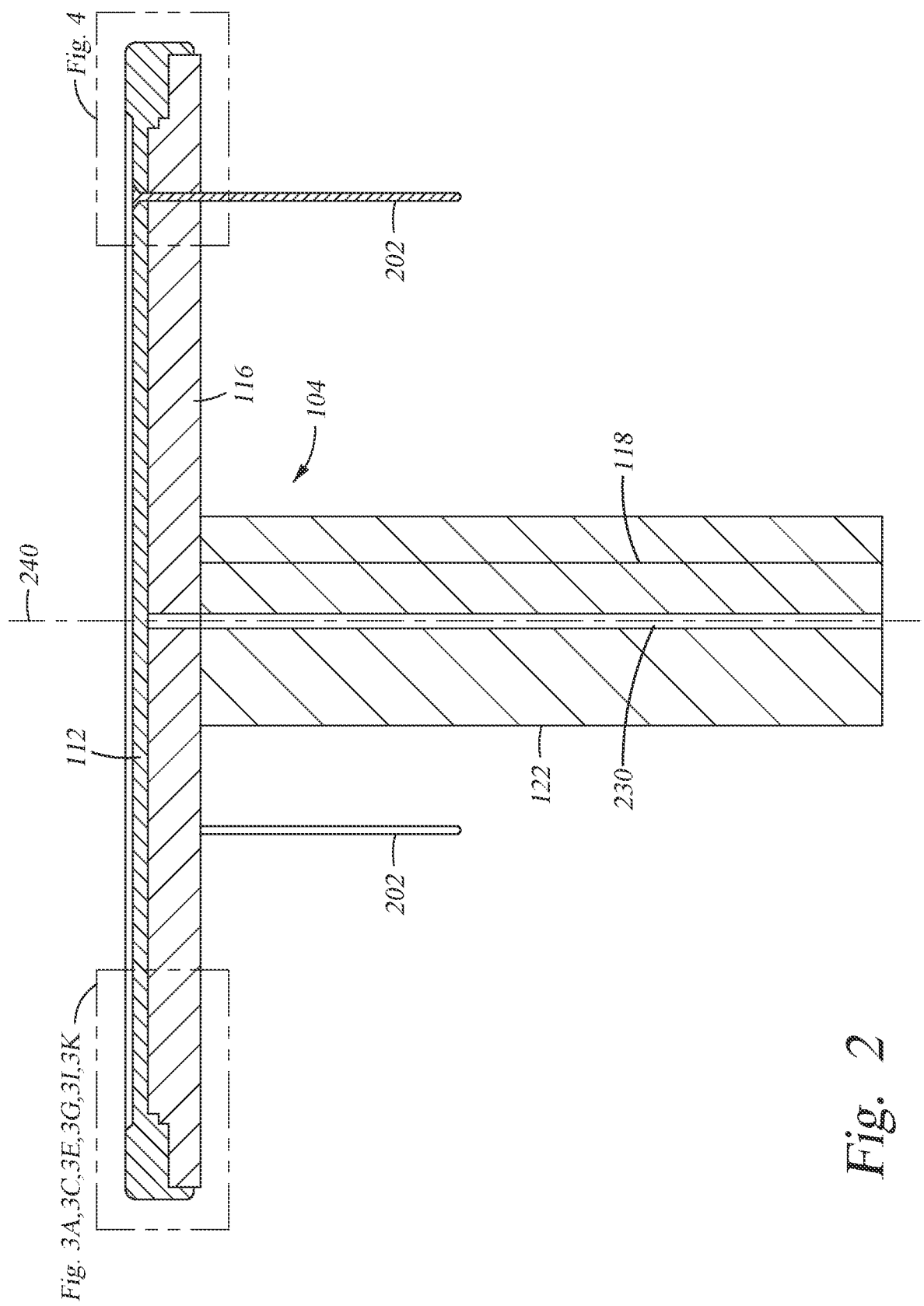

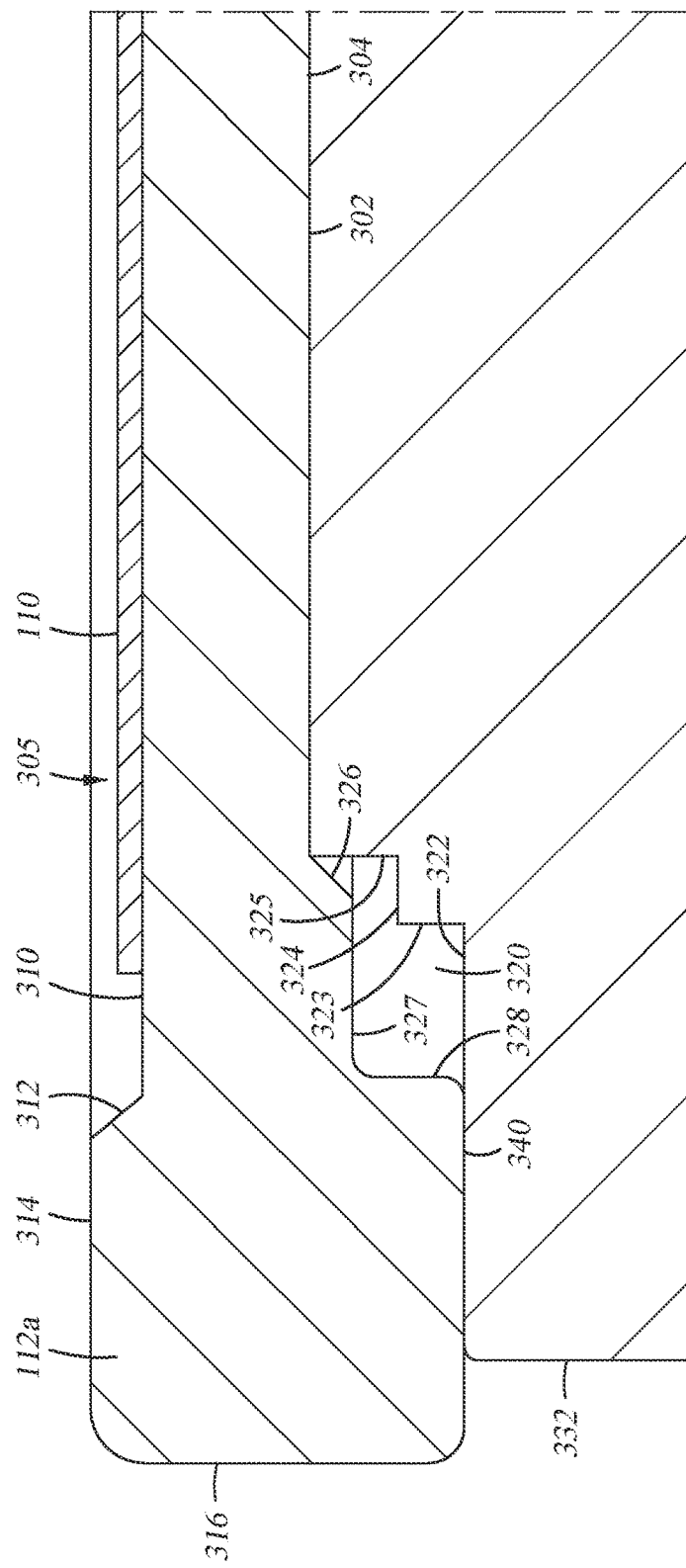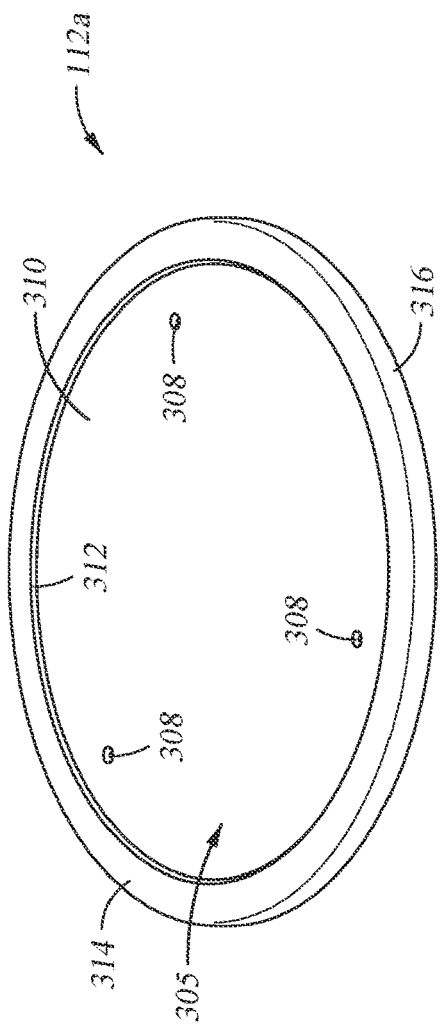
Fig. 3A
Fig. 3B

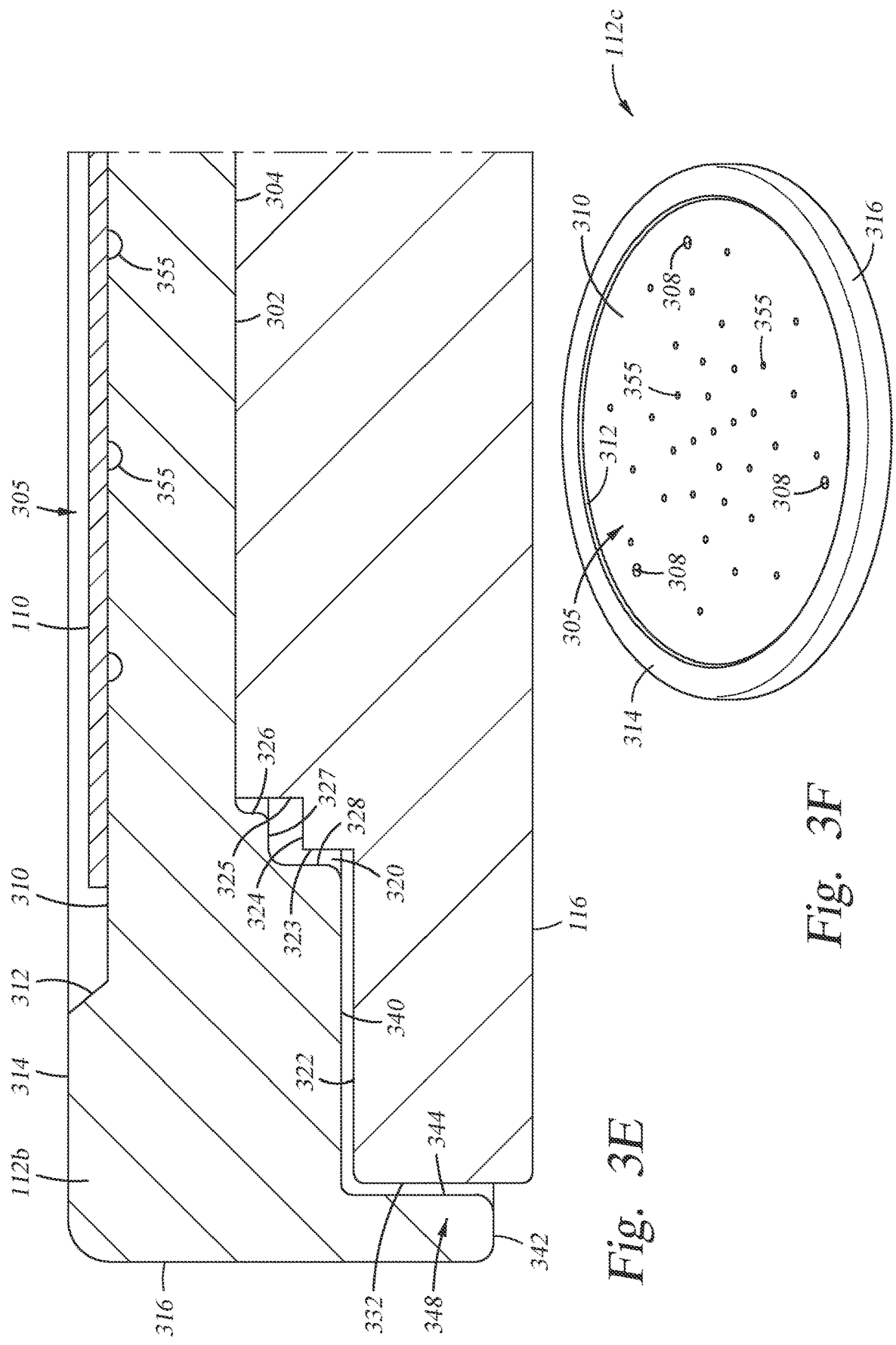

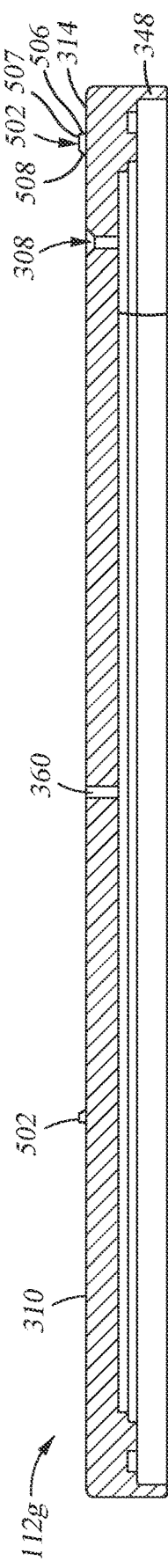
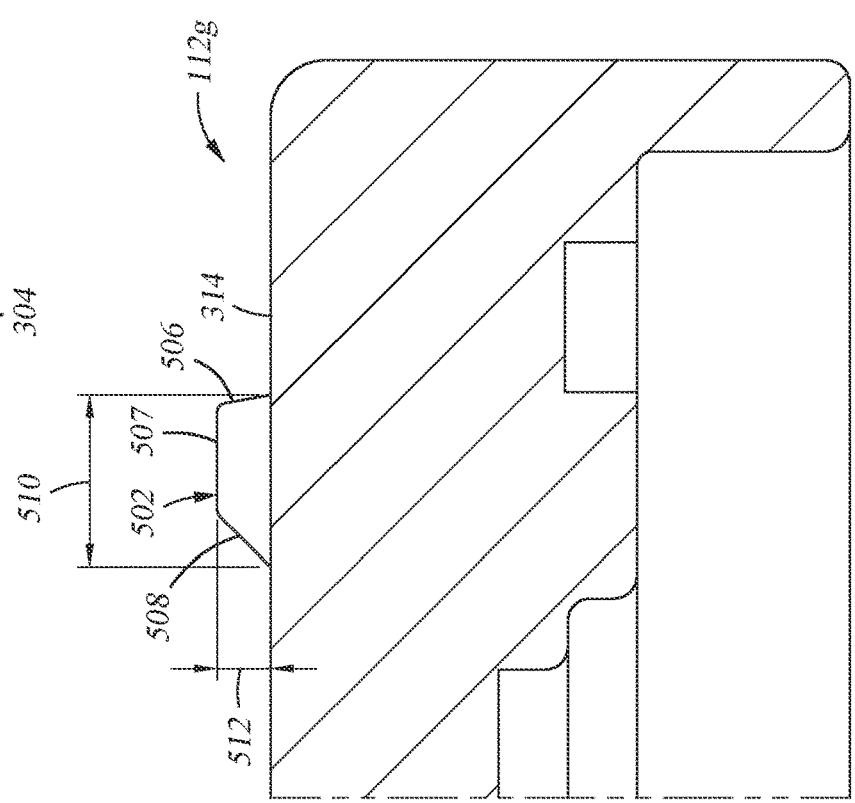
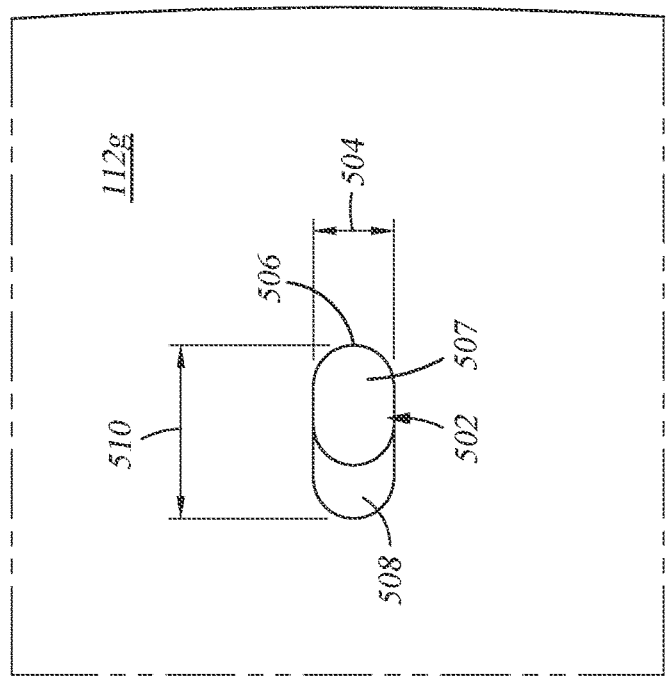
Fig. 5B
Fig. 5D
Fig. 5C

HEATER COVER PLATE FOR UNIFORMITY IMPROVEMENT

CROSS-REFERENCE TO RELATED APPLICATIONS

This application claims priority to U.S. Provisional Patent Application No. 63/017,381, filed Apr. 29, 2020, the entirety of which is herein incorporated by reference.

BACKGROUND

Field

Embodiments of the present disclosure generally relate to the fabrication of integrated circuits and to apparatus for use within a substrate processing chamber to improve film thickness uniformity. For example, embodiments herein generally relate to substrate supports and substrate support covers.

Description of the Related Art

A primary goal of substrate processing is to obtain the largest useful surface area, and as a result the greatest number of chips, possible from each substrate. Some factors to consider include processing variables that effect the uniformity and thickness of the layer deposited on the substrate, and contaminants that can attach to the substrate and render all or a portion of the substrate useless. Controlling these factors maximizes the useful surface area for each substrate processed.

Heated substrate supports have traditionally been used to improve film thickness uniformity by improving temperature uniformity across a substrate receiving surface. However, typical heated substrate supports have varying temperature uniformity depending on heating element distribution. Many heated substrate supports are susceptible to local hot and cold spots. Some heated substrate supports include a substrate receiving surface smaller than the diameter of a substrate disposed thereon. Smaller heated substrate supports encounter issues regulating edge temperature of substrates where the substrate has a larger diameter than the heated substrate supports.

Some heated substrate supports include pockets. However, for processes in which it is difficult to clean deposition products from the heated substrate supports, the pockets cause the heated substrate supports to be replaced more frequently and increases maintenance costs, while negatively impacting reliability.

Accordingly, there is a need in the art for an apparatus that improves temperature uniformity.

SUMMARY

Embodiments of the present disclosure generally relate to an apparatus for improving the film thickness on a substrate when using a heated substrate support.

In one embodiment, a cover plate for substrate processing includes an annular body. The annular body further includes a planar substrate receiving surface, a heater interface surface parallel to the planar substrate receiving surface, a plurality of lift pin holes formed through the annular body, an outer top surface disposed radially outward of the planar substrate receiving surface, a bottom surface disposed radially outward from the heater interface surface, and an annular stepped region between the heater interface surface and the bottom surface. The annular stepped region further includes a first annular step disposed radially outward from an outer edge of the heater interface surface, a second annular step disposed radially outward from the first annular step, and an intermediate surface connecting the first annular step and the second annular step.

In another embodiment, the cover plate for substrate processing includes an annular body. The annular body further includes a substrate receiving surface, a heater interface surface parallel to the substrate receiving surface, a plurality of lift pin holes formed through the annular body, a top surface disposed radially outward of the substrate receiving surface, a bottom surface disposed radially outward from the heater interface surface, and a plurality of pin slots extending from the bottom surface into the cover plate.

In yet another embodiment, an assembly for supporting a substrate includes a heated substrate support, a plurality of lift pins, a plurality of securing pins disposed along an outer edge of the heated substrate support, and an annular cover plate disposed on top of and covering an upper surface of the heated substrate support. The annular cover plate further includes a substrate receiving surface, a heater interface surface parallel to the substrate receiving surface, a plurality of lift pin holes formed through the annular cover plate, an top surface disposed radially outward of the substrate receiving surface, a bottom surface disposed radially outward from the heater interface surface, and a plurality of pin slots extending from the bottom surface into the annular cover plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 2 is a schematic cross sectional view of a substrate support assembly, according to embodiments of the disclosure.

FIG. 3A is an enlarged cross sectional view of a first embodiment of a cover plate assembly, according to embodiments of the disclosure.

FIG. 3B is a front isometric top view of the first embodiment of the cover plate assembly, according to embodiments of the disclosure.

FIG. 3E is an enlarged cross sectional view of a third embodiment of the cover plate assembly, according to embodiments of the disclosure.

FIG. 3F is a front isometric top view of the third embodiment of the cover plate assembly, according to embodiments of the disclosure.

FIG. 5B is a cross sectional view of the seventh embodiment of the cover plate assembly, according to embodiments of the disclosure.

FIG. 5C is an enlarged plan view of a protrusion formed on the seventh embodiment of the cover plate assembly, according to embodiments of the disclosure.

FIG. 5D is an enlarged cross sectional view of a protrusion formed on the seventh embodiment of the cover plate assembly, according to embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
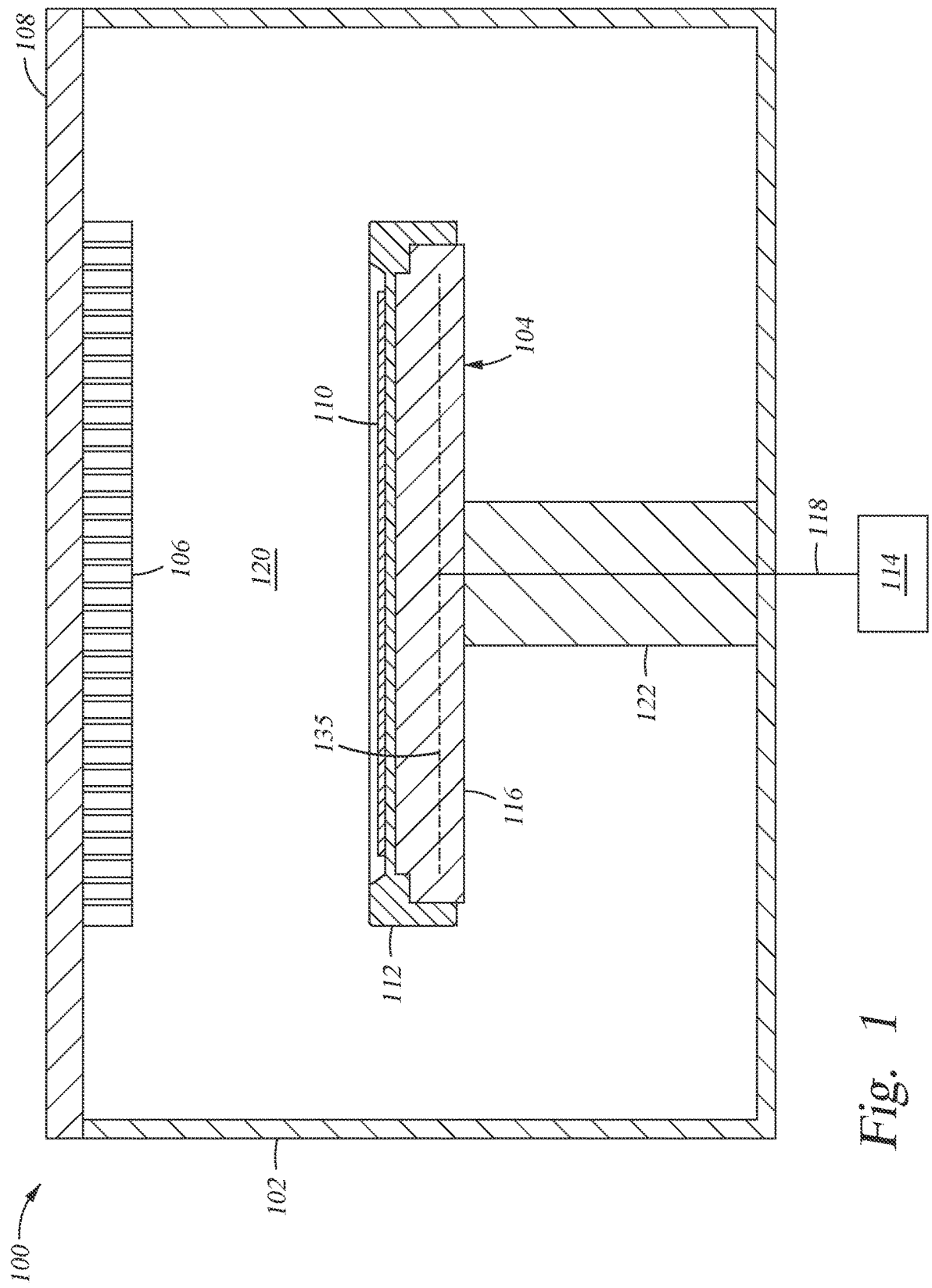
FIG. 1 is a schematic cross sectional view of a process chamber, according to embodiments of the disclosure.

FIG. 1 is a schematic cross sectional view of a process chamber 100. The process chamber 100 includes chamber walls 102, a lid 108, a showerhead assembly 106, and a substrate support assembly 104. The chamber walls 102, the lid 108, and the showerhead assembly 106 form a processing volume 120. The processing volume 120 is the volume in which substrate processing is performed. The showerhead assembly 106 is coupled to or formed through the lid 108. The showerhead assembly 106 may be any suitable showerhead assembly and may be configured to disperse process gases or plasmas into the processing volume 120.

The lid 108 is disposed on top of the chamber walls 102. In some embodiments, the chamber walls 102 are sidewalls of the process chamber 100. The chamber walls 102 include the bottom of the process chamber 100. The lid 108 is disposed above the substrate support assembly 104. The lid 108 and the chamber walls 102 form the processing volume 120.

In some embodiments, the showerhead assembly 106 may include a plurality of plates or diffusers, and/or may be connected to a remote plasma source. The showerhead assembly 106 shown in FIG. 1 is not limiting in use of other equally effective showerhead assemblies. In some embodiments, the showerhead assembly 106 is a plate stack including various other diffusers, plates, or apertures.

The substrate support assembly 104 includes a heated substrate support 116 and a cover plate assembly 112. A substrate 110 is disposed on top of the cover plate assembly 112. The heated substrate support 116 is a resistively heated substrate support, such that the temperature of the heated substrate support 116 is controlled using resistive heating elements 135 disposed within the heated substrate support 116. The resistive heating elements 135 may be disposed within the heated substrate support 116 in any suitable pattern. The heated substrate support 116 is disposed on top of a support shaft 122. The cover plate assembly 112 is disposed on top of and at least partially covering the sides of the heated substrate support 116. The cover plate assembly 112 is a ceramic material, such as an aluminum oxide (e.g., $Al_2O_3$) or aluminum nitride (AlN), and formed by a sintering process. The substrate 110 may be any suitable substrate and is disposed on top of the cover plate assembly 112. The substrate 110 may be in any state of development. In some embodiments, the substrate 110 is a silicon substrate. In yet other embodiments, the substrate 110 is a doped silicon substrate, such that the substrate 110 is doped with boron, germanium, aluminum, gallium, carbon, nitrogen, or phosphorous.

A power line 118 and a controller 114 are connected to the support shaft 122 of the substrate support assembly 104. The power line 118 is disposed through the support shaft 122 (See FIG. 2) and connects the controller 114 to the heated substrate support 116. The controller 114 includes a power source and is configured to control the resistive heating elements 135 disposed within the heated substrate support 116. The controller 114 may additionally be configured to control movement of the substrate support assembly 104 using a mechanical actuation to adjust the vertical position of the substrate support 116.

FIG. 2 is a schematic cross sectional view of a substrate support assembly 104. The substrate support assembly 104 of FIG. 2 includes the heated substrate support 116, the cover plate assembly 112, a plurality of lift pins 202, a gas supply line 230, and the power line 118. The plurality of lift pins 202 are disposed through the cover plate assembly 112 and the heated substrate support 116, such that the tops of the plurality of lift pins 202 are below a substrate, shown in FIG. 1. In some embodiments there are three lift pins 202.

The gas supply line 230 and the power line 118 are disposed through the support shaft 122 of the substrate support assembly 104. The gas supply line 230 extends through the support shaft 122 into the heated substrate support 116 and terminates at a backside of the cover plate assembly 112, such that backside gases are provided to the backside of the cover plate assembly 112 by the gas supply line 230. The gas supply line 230 is connected to a purge gas supply (not shown).

A central axis 240 is the central axis of the substrate support assembly 104, such that the central axis 240 is disposed through the center of the support shaft 122, the heated substrate support 116, and the cover plate assembly 112.

FIG. 3A is an enlarged cross sectional view of a first embodiment of a cover plate assembly 112a. The cover plate assembly 112a includes a substrate receiving surface 310, a heater interface surface 304, an outer surface 316, a top surface 314, and a bottom surface 340. The substrate receiving surface 310 is disposed in a pocket 305 within the top surface 314.

The pocket 305 is vertically offset from and below the top surface 314 of the cover plate assembly 112a. The substrate receiving surface 310 is the inner surface of the pocket 305, such that the substrate receiving surface 310 is vertically offset from the top surface 314. The pocket 305 is sized to receive a substrate, such as a 200 millimeter substrate, a 300 millimeter substrate, a 450 millimeter substrate, or other suitable substrates. The pocket 305 is a circular cavity disposed in the top surface 314 of the cover plate assembly 112a. In some embodiments, which can be combined with other embodiments, the pocket 305 has a diameter of about 250 mm to about 350 mm, such as about 280 mm to about 330 mm, such as about 285 mm to about 325 mm, such as about 295 mm to about 315 mm, such as about 295 mm to about 310 mm, such as about 300 mm to about 305 mm. The substrate receiving surface 310 is connected to the top surface 314 by a slanted top surface 312. The slanted top surface 312 is a slanted ring, which connects the outer edge of the substrate receiving surface 310 and the inner edge of the top surface 314. The slanted top surface 312 slopes downward from the top surface 314 to the substrate receiving surface 310. In some embodiments, the angle of the slanted top surface 312 with respect to the substrate receiving surface 310 is about 25 degrees to about 85 degrees, such as about 35 degrees to about 80 degrees, such as about 45 degrees to about 75 degrees. In some embodiments, the angle of the slanted top surface 312 with respect to the substrate receiving surface 310 is about 35 degrees to about 55 degrees, such as about 40 degrees to about 50 degrees, such as about 45 degrees. In other embodiments, the angle of the slanted top surface 312 with respect to the substrate receiving surface 310 is about 60 degrees to about 85 degrees, such as about 65 degrees to about 80 degrees, such as about 70 degrees to about 80 degrees, such as about 75 degrees.

The pocket 305 is vertically offset from the top surface 314 of the cover plate assembly 112a by about 0 millimeters to about 6 millimeters, such as about 0 millimeters to about 4 millimeters, such as about 0 millimeters to about 2.5 millimeters, such as about 0.5 millimeters to about 2.5 millimeters, such as about 0.5 millimeter to about 1.5 millimeters. The pocket 305 may have a similar offset from the top surface 314 in other embodiments described herein.

The top surface 314 is an annular outer surface. The top surface 314 surrounds the pocket 305. The top surface 314 is a horizontal surface and extends between the slanted top surface 312 of the pocket 305 and the outer surface 316 of the cover plate assembly 112a. The outer surface 316 of the cover plate assembly 112a is a vertical surface and is the most radially outward surface of the cover plate assembly 112a. The outer surface 316 is connected to the outer surface of the top surface 314 by a curved edge. In one example, the top surface 314 is parallel to the substrate receiving surface 310.

The bottom surface 340 of the cover plate assembly 112a is connected to the distal end of the outer surface 316 furthest from the top surface 314. The bottom surface 340 extends radially inward from the outer surface 316. The bottom surface 340 is disposed adjacent to the outer top surface 322 of the heated substrate support 116. The bottom surface 340 is a horizontal surface, parallel to the top surface 312 and the substrate receiving surface 310. The bottom surface 340 extends from the outer surface 316 to the first stepped surface 328. The first stepped surface 328 is a vertical surface extending upwards from the bottom surface 340, such that the cover plate assembly 112a has a reduced inner diameter at the first stepped surface 328. The first stepped surface 328 is disposed on the distal end of the bottom surface 340 furthest from the outer surface 316.

The first stepped surface 328 connects to the second stepped surface 327. The second stepped surface 327 is a horizontal surface disposed radially inward of the first stepped surface 328. The second stepped surface 327 is connected to the first stepped surface 328 by a curved corner. The second stepped surface 327 connects to a third stepped surface 326. The third stepped surface 326 is either a slanted surface or another set of stepped surfaces as shown in FIGS. 3E, 3G, 3I, and 3K. The third stepped surface 326 has a positive slope as the third stepped surface approaches the central axis 240 (FIG. 2) and the cover plate assembly 112a narrows as the cover plate assembly 112a extends radially inwards and upwards. The third stepped surface 326 is connected to the radially inward distal end of the second stepped surface 327. The third stepped surface 326 is disposed between the second stepped surface 327 and the heater interface surface 304.

The heater interface surface 304 is a horizontal surface, positioned parallel to the top surface 312 and the substrate receiving surface 310. The heater interface surface 304 extends radially inward from the third stepped surface 326, such that the heater interface surface 304 is disposed radially inwards of the first stepped surface 328, the second stepped surface 327, and the bottom surface 340. The heater interface surface 304 is disposed below the substrate receiving surface 310 of the pocket 305, such that the heater interface surface 304 has a smaller outer radius than the substrate receiving surface 310. The heater interface surface 304 is sized to interact with a top heater surface 302 of the heated substrate support 116. In some embodiments, the heater interface surface 304 is parallel and adjacent to the top heater surface 302 of the heated substrate support 116. The heater interface surface 304 described herein is a circular surface and forms a disk.

The first stepped surface 328, the second stepped surface 327, and the third stepped surface 326 form a cavity 320 between the cover plate assembly 112a and the heated substrate support 116. The cavity 320 is formed by the first, second, and third stepped surfaces 328, 327, 326 as well as the outer top surface 322, the first heater step 323, the second heater step 324, and the third heater step 325. The outer top surface 322 is a horizontal outer surface of the heated substrate support 116. The first heater step 323 is a vertical surface connected to the radially inward end of the outer top surface 322. The second heater step 324 is a horizontal surface connected to the top edge of the first heater step 323, such as the radially distant edge of the first heater step 323 from the outer top surface 322. The third heater step 325 is a vertical step connected to the radially inward end of the second heater step 324. The top edge of the third heater step 325 connects to the top heater surface 302. The cavity 320 forms a gap between the cover plate assembly 112a and the heated substrate support 116 and assists in preventing damages caused by differences in thermal expansion of the cover plate assembly 112a and the heated substrate support 116.

The first heater step 323 and the third heater step 325 are parallel to the first stepped surface 328 of the cover plate assembly 112a. The second heater step 324 is parallel to the second stepped surface 327 of the cover plate assembly 112a. The heated substrate support 116 further includes an outer surface 332. The outer surface 332 of the heated substrate support 116 is disposed radially inwards of the outer surface 316 of the cover plate assembly 112a. The outer surface 332 of the heated substrate support 116 is connected to the outer edge of the outer top surface 322. The outer surface 332 is a vertical surface.

FIG. 3B is a front isometric top view of a first embodiment of the cover plate assembly 112a. The first embodiment of the cover plate assembly 112a includes lift pin holes 308, a pocket 305, a substrate receiving surface 310, a top surface 314, and an outer surface 316. The cover plate assembly 112a shown in FIG. 3B is the cover plate assembly 112a shown in FIG. 3A.

The pocket 305, substrate receiving surface 310, top surface 314, outer surface 316, and the slanted top surface 312 are the same as described above with relation to FIG. 3A. The top surface 314 is an annular surface surrounding the pocket 305. The substrate receiving surface 310 is a circular surface. The substrate receiving surface 310 is a planar surface. The lift pin holes 308 are disposed through the substrate receiving surface 310. In some embodiments there are three lift pin holes 308 disposed through the substrate receiving surface 310. The lift pin holes 308 are evenly spaced about the center of the substrate receiving surface. The outer surface 316 is an annular surface disposed around the outermost edge of the cover plate assembly 112a. The slanted top surface 312 is an annular surface, which connects the top surface 314 and the substrate receiving surface 310.

The cover plate assembly 112a improves temperature uniformity of the substrate by spreading head load from local hot and cold spots on the heated substrate support 116. The cover plate assembly 112a is easily recycled and is easily removed for maintenance.

Figure 3C:
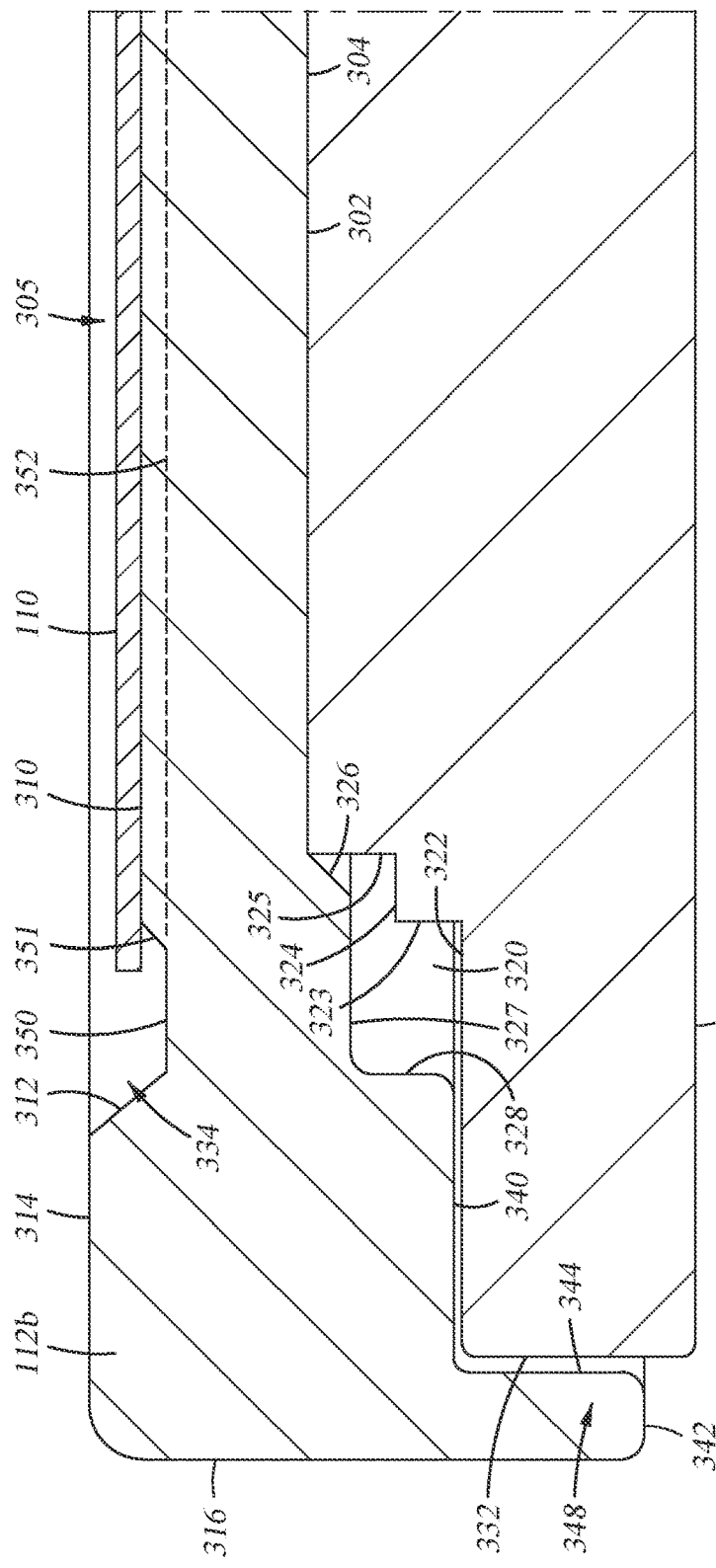
FIG. 3C is an enlarged cross sectional view of a second embodiment of the cover plate assembly, according to embodiments of the disclosure.

FIG. 3C is an enlarged cross sectional view of a second embodiment of the cover plate assembly 112b. The cover plate assembly 112b includes a substrate receiving surface 310, a heater interface surface 304, an outer surface 316, a top surface 314, and a bottom surface 340. The substrate receiving surface 310 is disposed in a pocket 305. The heated substrate support 116 shown in FIG. 3C is the same as the heated substrate support 116 described with relation to FIG. 3A.

The pocket 305 is vertically offset from the top surface 314 of the cover plate assembly 112b. The substrate receiving surface 310 is the inner surface of the pocket 305, such that the substrate receiving surface 310 is vertically offset from the top surface 314. The pocket 305 is sides to receive a substrate, such as a 200 millimeter substrate, a 300 millimeter substrate, a 450 millimeter substrate, or other suitable substrates. The pocket 305 is a circular cavity disposed in the top surface 314 of the cover plate assembly 112b. In some embodiments, the pocket 305 has a diameter of about 250 mm to about 350 mm, such as about 280 mm to about 330 mm, such as about 285 mm to about 325 mm, such as about 295 mm to about 315 mm, such as about 295 mm to about 310 mm, such as about 300 mm to about 305 mm. The substrate receiving surface 310 is connected to the top surface 314 by an outer pocket groove 334.

The outer pocket groove 334 includes the slanted top surface 312, a bottom groove surface 350, and a slanted groove surface 351. The slanted top surface 312 is a ring with an angled inner surface, which connects the outer edge of the bottom groove surface 350 and the inner edge of the top surface 314. The slanted top surface 312 slopes downward from the top surface 314 to the bottom groove surface 350. The bottom groove surface 350 is a horizontal surface disposed between the slanted top surface 312 and the slanted groove surface 351. The bottom groove surface 350 is an annular surface, which connects the slanted top surface 312 and the slanted groove surface 351. The bottom groove surface 350 is vertically offset from both the substrate receiving surface 310 and the top surface 314. In some embodiments, the outer pocket groove 334 may be a groove formed in the substrate receiving surface 310, such that the bottom groove surface 350 is disposed vertically below the substrate receiving surface 310. The slanted groove surface 351 connects the bottom groove surface 350 and the substrate receiving surface 310. The slanted groove surface 351 slopes upwards from the bottom groove surface 350 to the substrate receiving surface 310.

The substrate receiving surface 310 and the outer pocket groove 334 are sized, such that when a substrate 110 is disposed on the substrate receiving surface 310, at least part of the substrate 110 is disposed over the outer pocket groove 334 (e.g., the perimeter of the substrate 110 is positioned vertically above the bottom groove surface 350). In some embodiments, the edge of the substrate 110 is disposed over at least a portion of the outer pocket groove 334.

One or more radially disposed grooves 352 are also disposed in the pocket 305. The radially disposed grooves 352 are disposed radially inwards from the outer pocket groove 334. The radially disposed grooves 352 have a bottom surface which is co-planar with the bottom groove surface 350. In some embodiments, the radially disposed grooves 352 are not co-planar with the bottom groove surface 350 and may be disposed such that the radially disposed grooves 352 are deeper than the bottom groove surface 350. In other embodiments, the radially disposed grooves 352 are shallower than the bottom groove surface 350. In some embodiments, the inner radius of the bottom groove surface 350 from the center of the cover plate assembly 112b is about 300 mm to about 310 mm, such as about 300 mm to about 305 mm, such as about 301 mm to about 304 mm. In some embodiments, the outer radius of the bottom groove surface 350 from the center of the cover plate assembly 112b is about 300 mm to about 310 mm, such as about 303 mm to about 308 mm, such as about 305 mm to about 306 mm. The depth of the one or more radially disposed grooves 352 is less than about 3 mm, such as less than about 2.5 mm. In some embodiments, the depth of the one or more radially disposed grooves 352 is between about 0.25 mm to about 3 mm, such as about 0.5 mm to about 2.5 mm, such as about 0.7 mm to about 2.3 mm.

The top surface 314 is an annular outer surface. The top surface 314 is the same as the top surface 314 in FIGS. 3A and 3B. The top surface 314 extends between the slanted top surface 312 of the pocket 305 and the outer surface 316 of the cover plate assembly 112b. The outer surface 316 of the cover plate assembly 112b is the same as the outer surface 316 of FIGS. 3A and 3B, but the outer surface 316 extends radially downwards past the bottom surface 340 of the cover plate assembly 112b, such that an overhang portion 348 is formed around the outer surface 332 of the heated substrate support 116.

The overhang portion 348 includes part of the outer surface 316 of the cover plate assembly 112b, a bottom overhang surface 342, and an inner overhang surface 344. The bottom overhang surface 342 is connected to the outer surface 316 and disposed radially inwards from the outer surface 316. The bottom overhang surface 342 is a horizontal surface and connects the outer surface 316 to the inner overhang surface 344. The inner overhang surface 344 is a vertical surface disposed adjacent to the outer surface 332 of the heated substrate support 116. The inner overhang surface 344 extends vertically upwards from the bottom overhang surface 342, such that the inner overhang surface 344 connects the bottom overhang surface 342 and the bottom surface 340 of the cover plate assembly 112b. The inner overhang surface 344 is parallel to the outer surface 316.

The bottom surface 340 extends radially inward from the inner overhang surface 344. The bottom surface 340 is disposed adjacent to the outer top surface 322 of the heated substrate support 116. The bottom surface 340, first stepped surface 328, the second stepped surface 327, and the third stepped surface 326 are all the same as those described in reference to FIGS. 3A and 3B.

Figure 3D:
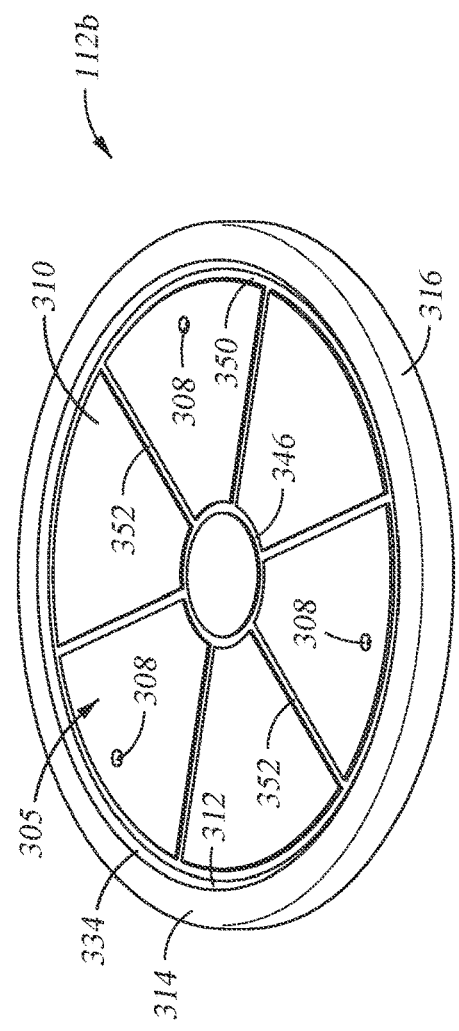
FIG. 3D is a front isometric top view of the second embodiment of the cover plate assembly, according to embodiments of the disclosure.

FIG. 3D is a front isometric top view of a second embodiment of the cover plate assembly. The second embodiment of the cover plate assembly 112b includes lift pin holes 308, a pocket 305, a substrate receiving surface 310, a top surface 314, an outer pocket groove 334, an overhang portion 348 (Shown in FIG. 3C), and an outer surface 316. The cover plate assembly 112b shown in FIG. 3D is the cover plate assembly 112b shown in FIG. 3C.

The pocket 305, substrate receiving surface 310, top surface 314, outer surface 316, the slanted top surface 312, the outer pocket groove 334, and the one or more radially disposed grooves 352 are the same as described above with relation to FIG. 3A. The cover plate assembly 112b is further shown to include an annular inner groove 346. The annular inner groove 346 is similar in depth to the one or more radially disposed grooves 352. The annular inner groove 346 is formed in the substrate receiving surface 310 and is disposed radially inwards of the outer pocket groove 334. The one or more radially disposed grooves 352 may be a plurality of grooves, such as 3 to 20 radially disposed grooves 352, such as 4 to 18 radially disposed grooves 352, such as 6 to 18 radially disposed grooves 352. In embodiments such as those shown herein, there are 6 radially disposed grooves 352 formed through the substrate receiving surface 310.

The lift pin holes 308 are disposed through the substrate receiving surface 310. In some embodiments there are three lift pin holes 308 disposed through the substrate receiving surface 310. The lift pin holes 308 are evenly spaced about the center of the substrate receiving surface.

The radially disposed grooves 352, the annular inner groove 346, and the outer pocket groove 334 allow for gas to escape from underneath a substrate, such as the substrate 110, during processing. Each of the radially disposed grooves 352, the annular inner groove 346, and the outer pocket groove 334 are in fluid communication with one another. The connection of the radially disposed grooves 352, the annular inner groove 346, and the outer pocket groove 334 allow for gas to flow out from the annular inner groove 346 to the radially disposed grooves 352 and out from under the substrate via the outer pocket groove 334. Removing the gas from underneath the substrate stabilizes the substrate such that the substrate does not slide within the pocket 305 of the cover plate assembly 112b.

The overhang portion 348 also assists in improving temperature uniformity of the substrate. The overhang portion 348 absorbs heat released by the outer surface 332 of the heated substrate support 116. The overhang portion 348 assists in evenly distributing heat to all portions of the cover plate assembly 112b.

FIG. 3E is an enlarged cross sectional view of a third embodiment of the cover plate assembly 112c. The cover plate assembly 112c includes a substrate receiving surface 310, a heater interface surface 304, an outer surface 316, a top surface 314, and a bottom surface 340. The substrate receiving surface 310 is disposed in a pocket 305. The cover plate assembly 112c is similar to the cover plate assembly 112a, but the cover plate assembly 112c includes a plurality of dimples 355, the overhang portion 348, and a vertical third stepped surface 326.

The pocket 305 of the cover plate assembly 112c in FIG. 3E is similar to the pocket 305 of the cover plate assembly 112a in FIG. 3A. The pocket 305 of the cover plate assembly 112c in FIG. 3E is different from the pocket 305 of the cover plate assembly 112a in FIG. 3A in that the pocket 305 of the cover plate assembly 112c in FIG. 3E includes a plurality of dimples 355 (Shown in FIG. 3F) disposed on the substrate receiving surface 310 within the pocket 305.

The top surface 314 is an annular outer surface. The top surface 314 is the same as the top surface 314 in FIGS. 3A and 3B. The top surface 314 extends between the slanted top surface 312 of the pocket 305 and the outer surface 316 of the cover plate assembly 112b.

The outer surface 316 of the cover plate assembly 112c is the same as the outer surface 316 of FIGS. 3A and 3B, but the outer surface 316 extends radially downwards past the bottom surface 340 of the cover plate assembly 112b, such that an overhang portion 348 is formed around the outer surface 332 of the heated substrate support 116. The overhang portion 348 is the same as the overhang portion 348 described with respect to FIG. 3C.

The bottom surface 340 extends radially inward from the inner overhang surface 344. The bottom surface 340 is disposed adjacent to the outer top surface 322 of the heated substrate support 116. The bottom surface 340 extends from the outer surface 316 to the first stepped surface 328. The first stepped surface 328 and the second stepped surface 327 are the same as described in relation to FIGS. 3A and 3C. The third stepped surface 326 is a vertical surface in the embodiment of FIGS. 3E and 3F. The cover plate assembly 112c narrows as the cover plate assembly 112c extends radially inwards. The third stepped surface 326 is connected to the radially inward distal end of the second stepped surface 327. The third stepped surface 326 is disposed between the second stepped surface 327 and the heater interface surface 304. The third stepped surface 326 is parallel to the third heater step 325.

The heater interface surface 304 is the same as described with respect to FIGS. 3A and 3C. The cavity 320 is formed between the cover plate assembly 112c and the heated substrate support 116 in the third embodiment of the cover plate assembly 112c described herein.

FIG. 3F is a front isometric top view of the third embodiment of the cover plate assembly. The third embodiment of the cover plate assembly 112c includes lift pin holes 308, the pocket 305, the substrate receiving surface 310, the top surface 314, the overhang portion 348 (Shown in FIG. 3E), the outer surface 316, and a plurality of dimples 355. The cover plate assembly 112c shown in FIG. 3F is the cover plate assembly 112c shown in FIG. 3E.

The pocket 305, substrate receiving surface 310, top surface 314, outer surface 316, the slanted top surface 312, and the one or more radially disposed grooves 352 are the same as described above with relation to FIG. 3E. The plurality of dimpled 355 are depressions in the substrate receiving surface 310. The dimples 355 may be randomly dispersed across the substrate receiving surface 310 or the dimples 355 may be patterned on the substrate receiving surface 310. In some embodiments, which may be combined with other embodiments, the dimples 355 are grouped in circles, such that the dimples may be dispersed in concentric circles across the substrate receiving surface 310. In yet other embodiments, the dimples 355 are evenly spaced across the substrate receiving surface 310, such that each of the dimples 355 are evenly spaced from one another. In some embodiments, there are more dimples 355 towards the center of the substrate receiving surface 310 than towards the edge of the substrate receiving surface. Inversely, there may be more dimples 355 towards the edge of the substrate receiving surface than towards the center of the substrate receiving surface 310.

In some embodiments, which may be combined with other embodiments, there may be 15 or more dimples 355, such as about 25 or more dimples 355, such as about 50 or more dimples 355. The dimples may have a depth of about 0.0025 millimeters to about 0.25 millimeters, such as about 0.01 millimeters to about 0.1 millimeters, such as about 0.02 millimeters to about 0.06 millimeters.

The lift pin holes 308 are disposed through the substrate receiving surface 310. In some embodiments there are three lift pin holes 308 disposed through the substrate receiving surface 310. The lift pin holes 308 are evenly spaced about the center of the substrate receiving surface.

The dimples 355 reduce sliding of a substrate, such as the substrate 110, disposed on the substrate receiving surface 310 during substrate processing. The dimples 355 also assist in improving temperature distribution across the cover plate assembly 112c.

Figure 3G:
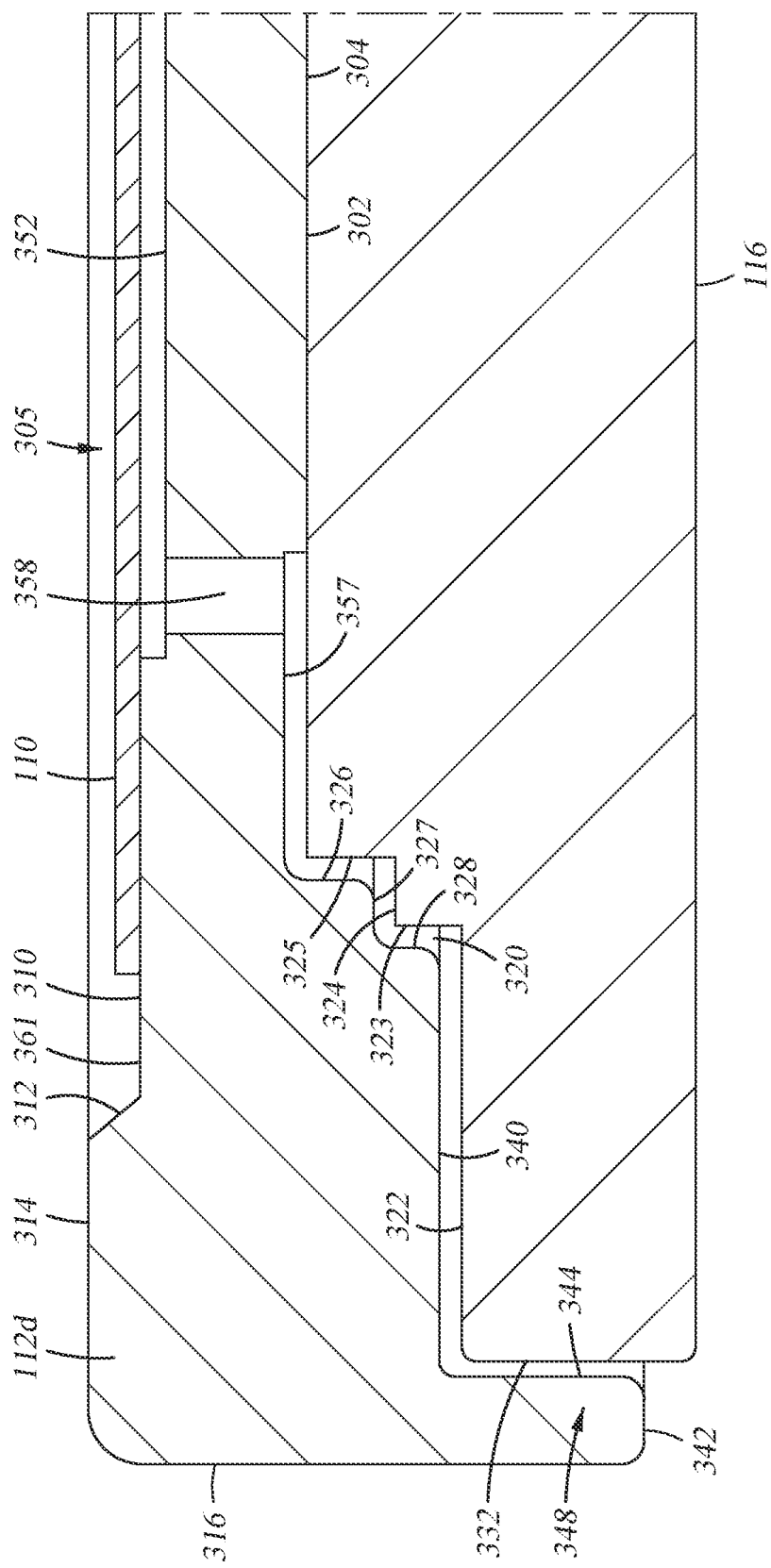
FIG. 3G is an enlarged cross sectional view of a fourth embodiment of the cover plate assembly, according to embodiments of the disclosure.
Figure 3H:
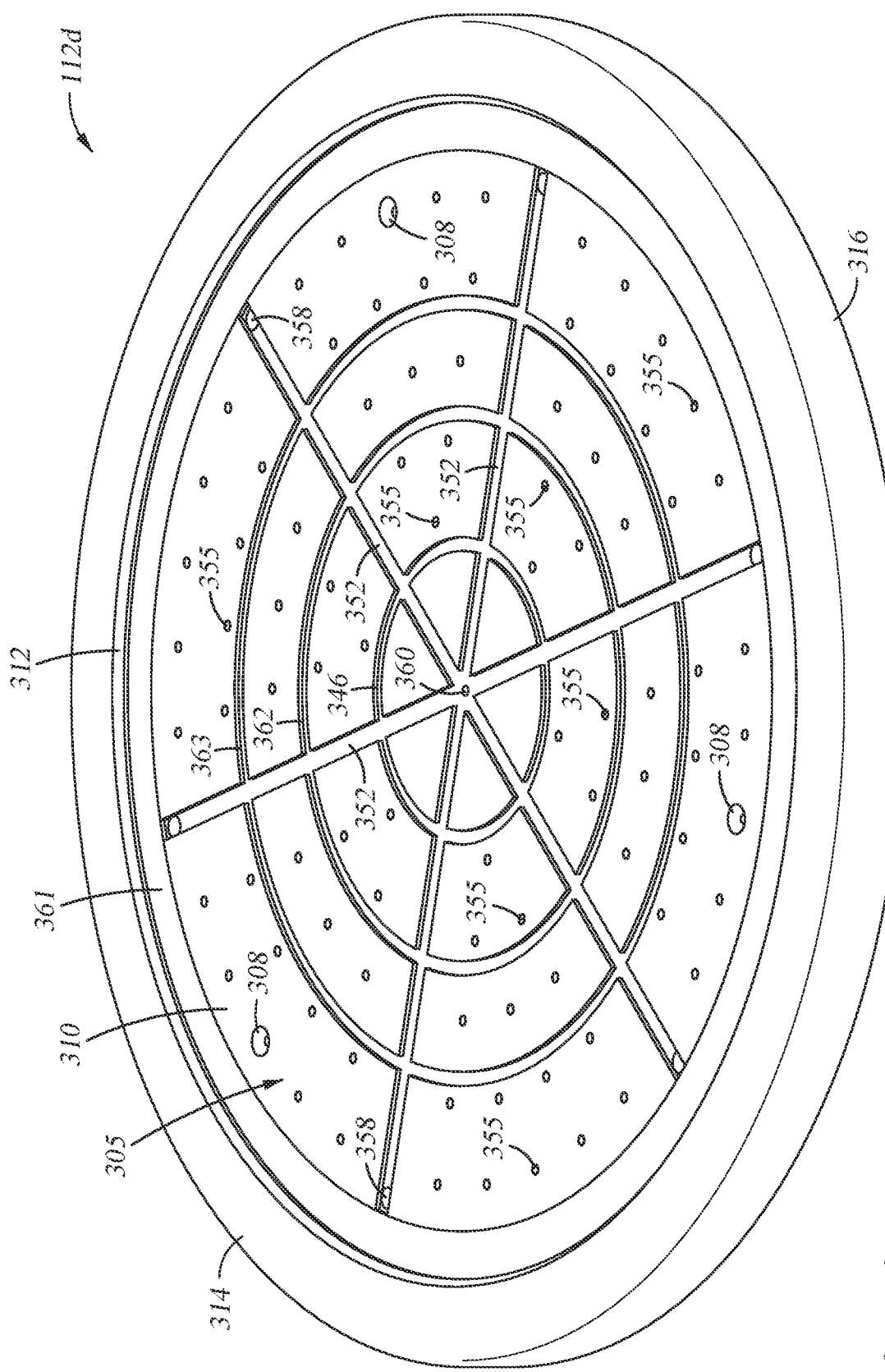
FIG. 3H is a front isometric top view of the fourth embodiment of the cover plate assembly, according to embodiments of the disclosure.

FIG. 3G is an enlarged cross sectional view of a fourth embodiment of the cover plate assembly 112d. The cover plate assembly 112d includes the substrate receiving surface 310, the heater interface surface 304, the outer surface 316, the top surface 314, the bottom surface 340, the radially disposed grooves 352, gas exhaust holes 358, the overhang portion 348, and dimples 355 (FIG. 3H). The substrate receiving surface 310 is disposed in the pocket 305.

The pocket 305 of the cover plate assembly 112c in FIG. 3E is similar to the pocket 305 of the cover plate assembly 112a in FIGS. 3A and 3E. The pocket 305 of the cover plate assembly 112d in FIG. 3G is different from the pocket 305 of the cover plate assembly 112a in FIG. 3A in that the pocket 305 of the cover plate assembly 112d in FIG. 3G includes a plurality of dimples 355 (Shown in FIG. 3G) disposed on the substrate receiving surface 310 within the pocket 305, one or more radially disposed grooves 352, and gas exhaust holes 358.

The radially disposed grooves 352 are similar to the radially disposed grooves 352 described with regard to FIGS. 3C and 3D. The radially disposed grooves 352 of FIGS. 3G and 3H are not in fluid communication with an outer pocket groove, such as the outer pocket groove 334 of FIGS. 3C and 3D. The radially disposed grooves 352 are disposed on the substrate receiving surface 310. When a substrate, such as the substrate 110 is disposed on the substrate receiving surface 310, the radially disposed grooves 352 are disposed entirely underneath the substrate 110. The radially outward portions of the radially disposed grooves 352 include gas exhaust holes 358 disposed therethrough. The gas exhaust holes 358 are formed through the bottom surface of the radially disposed grooves 352 and extend to the heater interface surface 304 of the cover plate assembly 112d. A gas exhaust hole 358 may be formed through the cover plate assembly 112d at the end of each of the radially disposed grooves 352. The dimples 355 are similar to the dimples described in FIGS. 3E and 3F.

The top surface 314 is an annular outer surface. The top surface 314 is the same as the top surface 314 in FIGS. 3A-3F. The top surface 314 extends between the slanted top surface 312 of the pocket 305 and the outer surface 316 of the cover plate assembly 112b. The outer surface 316 of the cover plate assembly 112c is the same as the outer surface 316 of FIGS. 3C-3F, such that an overhang portion 348 is formed around the outer surface 332 of the heated substrate support 116.

The bottom surface 340 extends radially inward from the inner overhang surface 344. The bottom surface 340 is disposed adjacent to the outer top surface 322 of the heated substrate support 116. The bottom surface 340 extends from the outer surface 316 to the first stepped surface 328. The first stepped surface 328 and the second stepped surface 327 are the same as described in relation to FIGS. 3A and 3C. The third stepped surface 326 is a vertical surface in the embodiment of FIGS. 3G and 3H. The cover plate assembly 112d narrows as the cover plate assembly 112d extends radially inwards. The third stepped surface 326 is connected to the radially inward distal end of the second stepped surface 327. The third stepped surface 326 is parallel to the third heater step 325. The third stepped surface 326 is disposed between the second stepped surface 327 and a bottom vent surface 357.

The bottom vent surface 357 is formed between the bottom of the gas exhaust hole 358 and the third stepped surface 326. The bottom vent surface 357 is vertically offset from the heater interface surface 304, such that the bottom vent surface 357 is disposed above the heater interface surface 304. The bottom vent surface 357 may form a venting line across an outer portion of the heater interface surface 304, such that the bottom vent surface 357 is spaced from the top heater surface 302. The bottom vent surface 357 is formed from the bottom of the gas exhaust hole 358 to the third stepped surface 326, such that in radial positions in which there is no gas exhaust hole 358, the heater interface surface 304 interacts with the third stepped surface 326 similarly as to in FIG. 3E. The bottom vent surface 357 is radially disposed between the gas exhaust hole 358 and the third stepped surface 326.

In the fourth embodiment of FIG. 3G, the radially disposed grooves 352, the gas exhaust hole 358, the bottom vent surface 357, the first stepped surface 328, the second stepped surface 327, the third stepped surface 326, the bottom surface 340, and the inner overhang surface are in fluid communication with one another and are spaced from the heated substrate support 116 in order to provide a path for gas to leave from under a substrate, such as the substrate 110, disposed on the cover plate assembly 112d.

This assembly enables the reduction of gas present underneath the substrate 110 during processing and therefore reduces movement of the substrate 110. The gas flow path provided by the radially disposed grooves 352, the gas exhaust hole 358, the bottom vent surface 357, the first stepped surface 328, the second stepped surface 327, the third stepped surface 326, the bottom surface 340, and the inner overhang surface additionally improves temperature distribution across the cover plate assembly 112d.

The cavity 320 is formed between the cover plate assembly 112d and the heated substrate support 116 in the fourth embodiment of the cover plate assembly 112d described herein. The cavity 320 is part of the flow path used for gas flow out from underneath the substrate 110.

FIG. 3H is a front isometric top view of a fourth embodiment of the cover plate assembly. The fourth embodiment of the cover plate assembly 112d includes lift pin holes 308, the pocket 305, the substrate receiving surface 310, the top surface 314, the overhang portion 348 (Shown in FIG. 3E), the outer surface 316, a plurality of dimples 355, the radially disposed grooves 352, the gas exhaust holes 358, a gas supply hole 360, an annular inner groove 346, an annular middle groove 362, an annular outer groove 363, and an outer receiving surface 361. The cover plate assembly 112d shown in FIG. 3H is the cover plate assembly 112d shown in FIG. 3G.

The pocket 305, substrate receiving surface 310, top surface 314, outer surface 316, the slanted top surface 312, and the one or more radially disposed grooves 352 are the same as described above with relation to FIG. 3E. The plurality of dimpled 355 are similar to the dimples 355 described above with relation to FIGS. 3E and 3F.

The gas supply hole 360 is disposed in the center of the substrate receiving surface 310. The gas supply hole 360 is formed through the cover plate assembly 112d, such that the gas supply hole 360 passes through the entire thickness of the cover plate assembly 112d at the center of the substrate receiving surface 310. The gas supply hole 360 is located at the intersection of a plurality of the radially disposed grooves 352. The gas supply hole 360 enables backside gas to be pumped onto the backside of a substrate, such as the substrate 110, disposed on the substrate receiving surface 310. The backside gas is provided to the gas supply hole 360 via the gas supply line 230 of FIG. 2. Providing backside gas reduces contamination of the bottom of the substrate during processing. Gas provided by the gas supply hole 360 is distributed via the annular inner groove 346, the annular middle groove 362, the annular outer groove 363, and the radially disposed grooves 352. Gas may be vented through the gas exhaust holes 358.

The annular inner groove 346 is described in FIG. 3D. The annular inner groove 346 is intersected by each of the radially disposed grooves 352. The annular inner groove 346 is centered on the cover plate assembly 112d, such that the annular inner groove 346 is disposed around the gas supply hole 360. The annular inner groove 346 is a circular groove disposed in the substrate receiving surface 310. The depth of the annular inner groove 346 is less than about 3 mm, such as less than about 2.5 mm. In some embodiments, the depth of the one or more radially disposed grooves is between about 0.25 mm to about 3 mm, such as about 0.5 mm to about 2.5 mm, such as about 0.7 mm to about 2.3 mm.

The annular middle groove 362 is disposed radially outward of the annular inner groove 346. The annular middle groove 362 is intersected by each of the radially disposed grooves 352. The annular middle groove 362 is centered on the cover plate assembly 112d, such that the annular middle groove 362 is disposed around the gas supply hole 360. The annular middle groove is a circular groove disposed in the substrate receiving surface 310. The annular middle groove 362 may have the same depth as the annular inner groove 346. Alternatively, the annular middle groove 362 has a depth different from that of the annular inner groove 346, such as a depth of about 0.025 mm to about 0.1 mm, such as about 0.03 mm to about 0.075 mm, such as about 0.04 mm to about 0.06 mm.

The annular outer groove 363 is disposed radially outward of the annular inner groove 346 and the annular middle groove 362. The annular outer groove 363 is intersected by each of the radially disposed grooves 352. The annular outer groove 363 is centered on the cover plate assembly 112d, such that the annular outer groove 363 is disposed around the gas supply hole 360. The annular outer groove is a circular groove disposed in the substrate receiving surface 310. The annular outer groove 363 may have the same depth as either of the annular inner groove 346 or the annular middle groove 362. Alternatively, the annular outer groove 363 is about 0.1 mm to about 0.5 mm in depth, such as about 0.2 mm to about 0.4 mm in depth, such as about 0.2 mm to about 0.3 mm in depth.

In some embodiments, each of the annular inner groove 346, the annular middle groove 362, and the annular outer groove 363 have the same depth, such as less than about 3 mm, such as less than about 2.5 mm. In some embodiments, the depth of the annular inner groove 346, the annular middle groove 362, and the annular outer groove 363 is between about 0.25 mm to about 3 mm, such as about 0.5 mm to about 2.5 mm, such as about 0.7 mm to about 2.3 mm. In some embodiments, there may only be an annular inner groove 346 and an annular outer groove 363. In other embodiments, there may be additional annular grooves formed in the substrate receiving surface 310, such that there are more than three annular grooves.

The outer receiving surface 361 is a planar surface, which extends from the substrate receiving surface 310. The outer receiving surface 361 is co-planar with the substrate receiving surface 310. The outer receiving surface 361 is devoid of dimples 355, annular grooves, or radially disposed grooves 352. The outer receiving surface 361 is an outer extension of the substrate receiving surface 310. The outer receiving surface 361 is disposed radially outward of the annular outer groove 363 and the gas supply holes 360.

Dimples 355 are located radially outward from the annular inner groove 346 and radially inward of the outer receiving surface 361. A plurality of dimples 355 are formed between the annular inner groove 346 and the annular middle groove 362. A plurality of dimples 355 are formed between the annular middle groove 362 and the annular outer groove 363. A plurality of dimples 355 are formed between the annular outer groove 363 and the outer receiving surface 361. The number of dimples 355 formed between the annular inner groove 346 and the annular middle groove 362 may be less than the number of dimples 355 formed between the annular middle groove 362 and the annular outer groove 363. The number of dimples 355 formed between the annular middle groove 362 and the annular outer groove 363 is less than the number of dimples 355 formed between the annular outer groove 363 and the outer receiving surface 361.

In other embodiments, the number of dimples 355 between the annular inner groove 346 and the annular middle groove 362 may be greater than the number of dimples 355 formed between the annular middle groove 362 and the annular outer groove 363. The number of dimples 355 formed between the annular middle groove 362 and the annular outer groove 363 is greater than the number of dimples 355 formed between the annular outer groove 363 and the outer receiving surface 361.

In yet another embodiment, the number of dimples 355 between the annular inner groove 346 and the annular middle groove 362 is equal to the number of dimples 355 formed between the annular middle groove 362 and the annular outer groove 363. The number of dimples 355 formed between the annular middle groove 362 and the annular outer groove 363 is equal to the number of dimples 355 formed between the annular outer groove 363 and the outer receiving surface 361.

In embodiments in which the dimples 355 are formed in concentric rings, the number of dimples 355 in each ring increases as the rings expand radially outward, such that a first ring of dimples 355 includes 2 to 8 dimples, a second ring of dimples includes 8 to 16 dimples, a third ring of dimples includes 16 to 22 dimples, a fourth ring of dimples includes 10 to 30 dimples, and a fifth ring of dimples includes 20 to 50 dimples.

In one embodiments, the first ring of dimples 355 includes four dimples, a second ring of dimples includes twelve dimples, a third ring of dimples includes 18 dimples, a fourth ring of dimples includes 24 dimples, and a fifth ring of dimples includes 27 dimples.

In some embodiments the number of dimples 355 between the annular inner groove 346 and the annular middle groove 362 may be 18 dimples 355. The number of dimples 355 formed between the annular middle groove 362 and the annular outer groove 363 is 18 dimples 355. The number of dimples 355 formed between the annular outer groove 363 and the outer receiving surface 361 is 24 dimples 355.

In some embodiments there is a total of 15 or more dimples 355, such as about 25 or more dimples 355, such as about 50 or more dimples 355. The dimples may have a depth of about 0.0025 millimeters to about 0.25 millimeters, such as about 0.01 millimeters to about 0.1 millimeters, such as about 0.02 millimeters to about 0.06 millimeters.

The lift pin holes 308 are disposed through the substrate receiving surface 310. In some embodiments there are three lift pin holes 308 disposed through the substrate receiving surface 310. The lift pin holes 308 are evenly spaced about the center of the substrate receiving surface. The lift pin holes 308 are disposed between the annular outer groove 363 and the outer receiving surface 361.

The dimples 355 reduce sliding of a substrate, such as the substrate 110, disposed on the substrate receiving surface 310 during substrate processing. The dimples 355 also assist in improving temperature distribution across the cover plate assembly 112d.

Figure 3I:
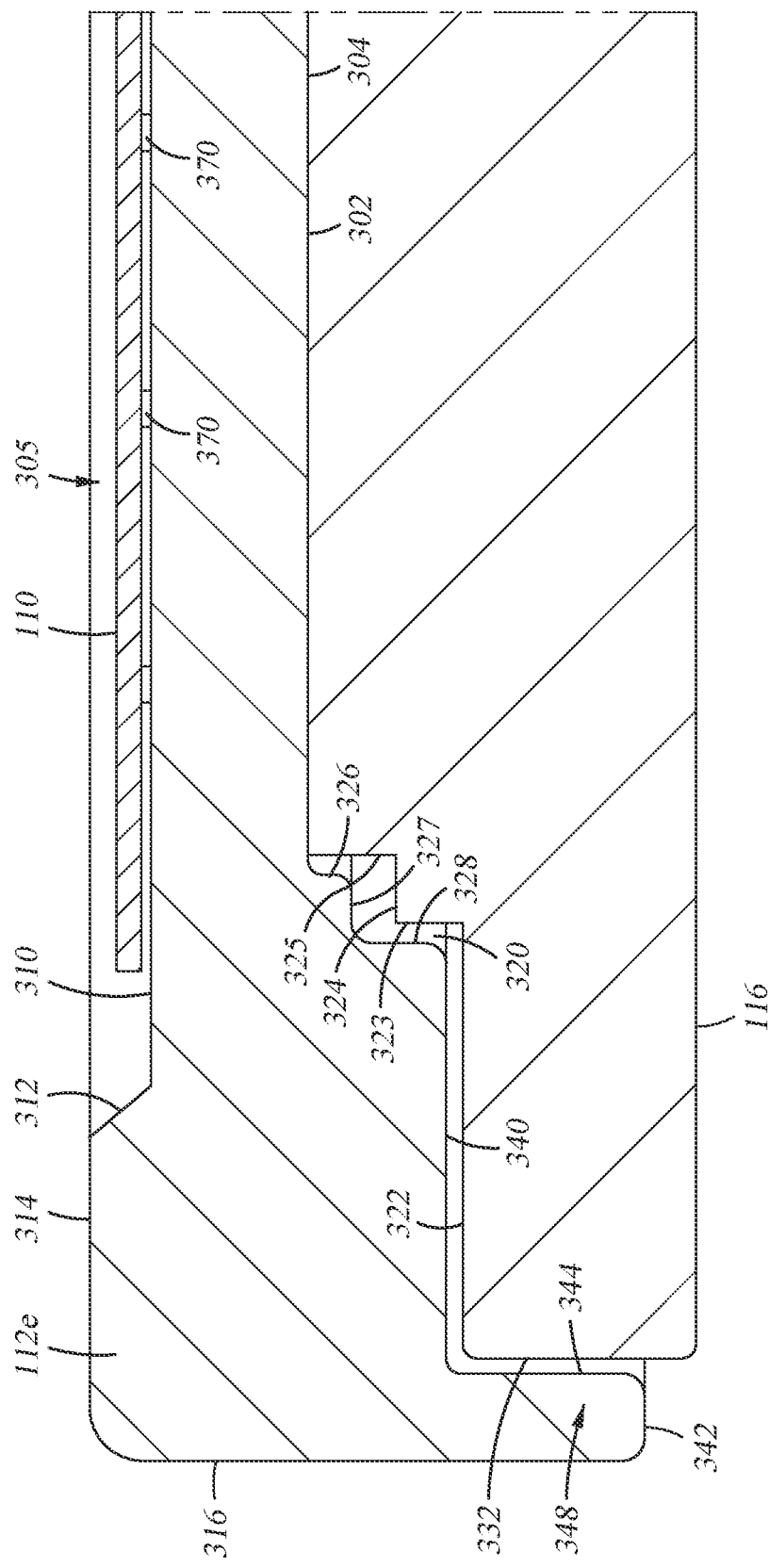
FIG. 3I is an enlarged cross sectional view of a fifth embodiment of the cover plate assembly, according to embodiments of the disclosure.

FIG. 3I is an enlarged cross sectional view of a fifth embodiment of the cover plate assembly 112e. The cover plate assembly 112e is similar to the cover plate assembly 112c of FIGS. 3E and 3F, but the dimples 355 are replaced with a plurality of projections 370. Each of the plurality of projections 370 are small mesas disposed on the substrate receiving surface 310. Each of the projections 370 are cylindrical and have a planar top surface. Alternatively, the projections 370 may be dome-shaped. Each of the plurality of projections 370 extend vertically upward from the substrate receiving surface 310. The planar top surface of each of the projections 370 is configured to support the substrate 110.

The plurality of projections 370 are sized to enable even support of the substrate 110. The plurality of projections 370 separate the substrate 110 from the substrate receiving surface 310 and enables gases between the substrate receiving surface 310 and the substrate 110 to be vented from beneath the substrate 110. The plurality of projections 370 as described herein have a height of about 0.0025 millimeters to about 0.25 millimeters, such as about 0.01 millimeters to about 0.1 millimeters, such as about 0.02 millimeters to about 0.06 millimeters. The height of the projections 370 enables the substrate 110 to contact the projections 370, while also forming openings for gas to escape from between the substrate 110 and the substrate receiving surface 310.

Figure 3J:
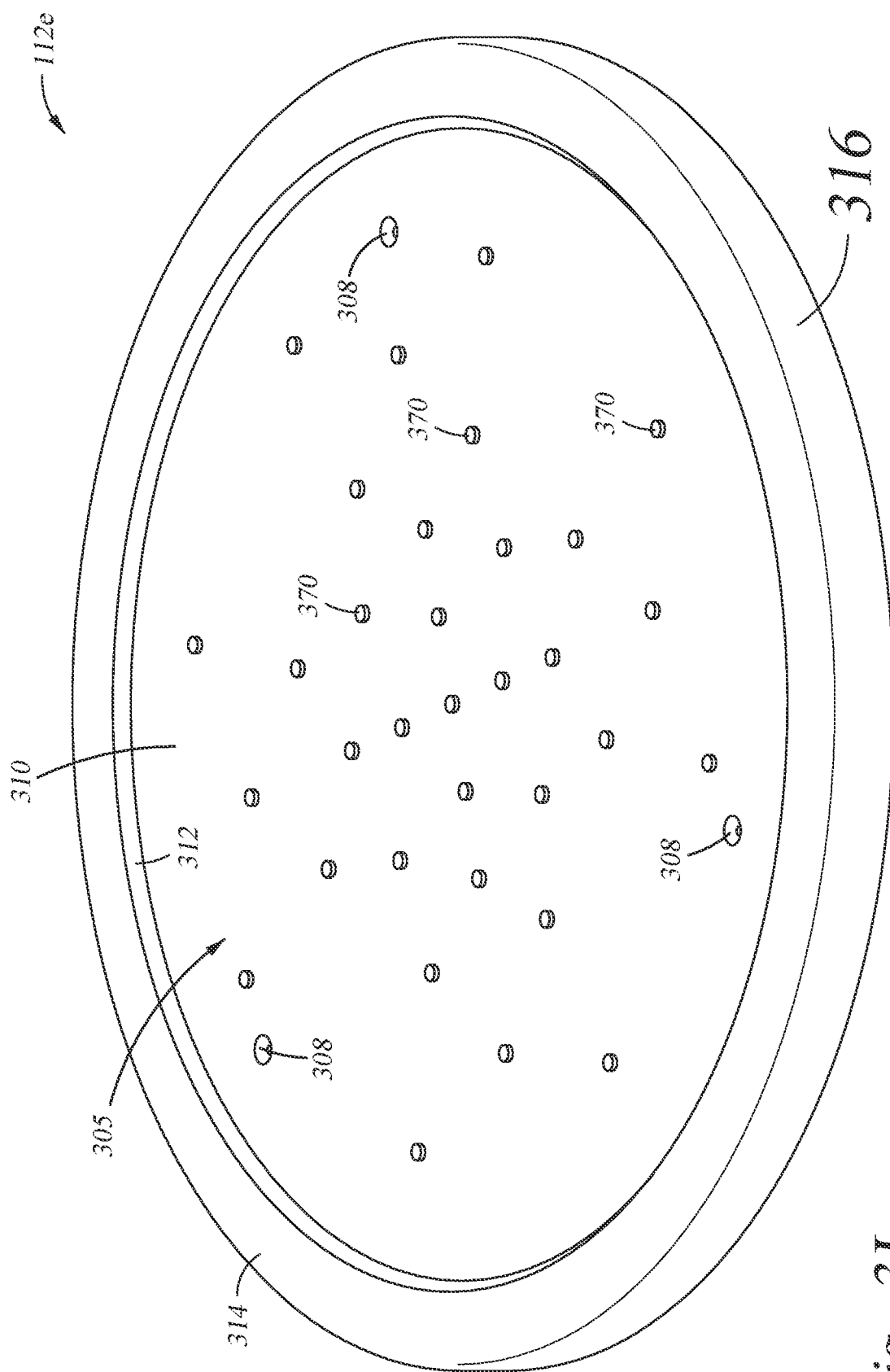
FIG. 3J is a front isometric top view of the fifth embodiment of the cover plate assembly, according to embodiments of the disclosure.

FIG. 3J is a front isometric top view of the fifth embodiment of the cover plate assembly. The fifth embodiment of the cover plate assembly 112d includes the lift pin holes 308, the pocket 305, the substrate receiving surface 310, the top surface 314, the overhang portion 348 (Shown in FIG. 3E), the outer surface 316, and a plurality of projections 370. The cover plate assembly 112e shown in FIG. 3J is similar to the cover plate assembly 112c of FIG. 3F, but the dimples 355 are replaced with the projections 370.

The projections 370 may be randomly dispersed across the substrate receiving surface 310 or the projections 370 may be patterned on the substrate receiving surface 310. In some embodiments, which may be combined with other embodiments, the projections 370 are grouped in circles, such that the projections 370 may be dispersed in concentric circles across the substrate receiving surface 310. In yet other embodiments, the projections 370 are evenly spaced across the substrate receiving surface 310, such that each of the projections 370 are evenly spaced from one another. In some embodiments, there are more projections 370 towards the center of the substrate receiving surface 310 than towards the edge of the substrate receiving surface 310. Inversely, there may be more projections 370 towards the edge of the substrate receiving surface than towards the center of the substrate receiving surface 310. As shown in FIG. 3J, the concentration of projections 370 is greater towards the center of the substrate receiving surface 310 than towards the outer edges of the substrate receiving surface 310.

In some embodiments, which may be combined with other embodiments, there may be 15 or more projections 370, such as about 25 or more projections 370, such as about 50 or more projections 370.

Figure 3K:
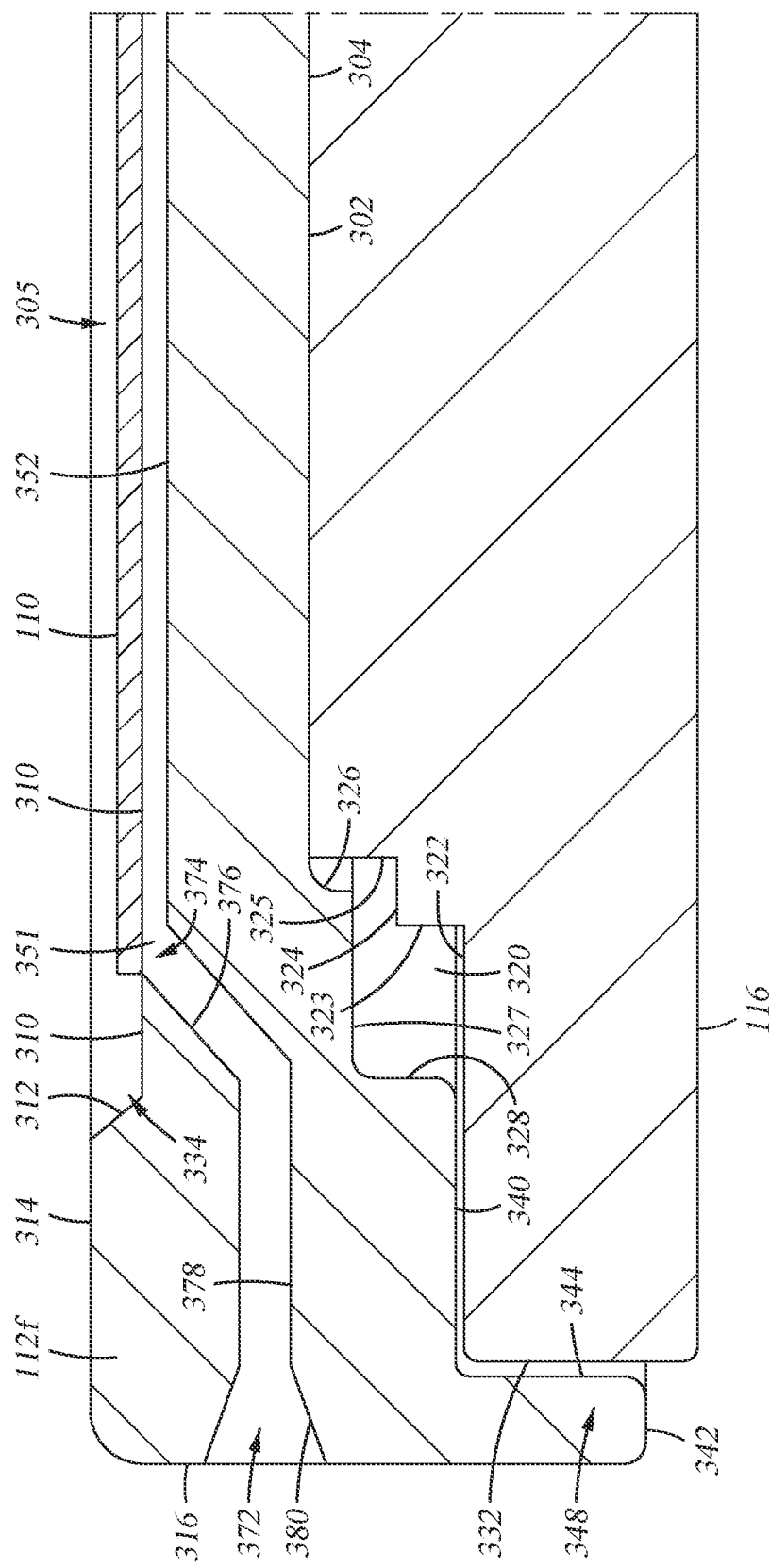
FIG. 3K is an enlarged cross sectional view of a sixth embodiment of the cover plate assembly, according to embodiments of the disclosure.

FIG. 3K is an enlarged cross sectional view of a sixth embodiment of the cover plate assembly 112f. The cover plate assembly 112e is similar to the cover plate assembly 112b of FIGS. 3C and 3D, but includes the projections 370 as described with respect to FIGS. 3I and 3J. The cover plate assembly 112e further includes additional radially disposed grooves 352 and gas exhaust holes 374. The gas exhaust holes 374 are similar to the gas exhaust holes 358 of FIGS. 3G and 3H, but the gas exhaust holes 374 are in fluid communication with the outer surface 316 of the cover plate assembly 112f instead of the heater interface surface 304.

The gas exhaust holes 374 are disposed at the distal ends of the radially disposed grooves 352 furthest from the annular inner groove 346. A single gas exhaust hole 374 extends through the bottom of each of the radially disposed grooves 352. Each gas exhaust hole 374 is fluidly connected to a first exhaust passage 376. The first exhaust passage 376 is an angled passage extending from the gas exhaust hole 374 towards the bottom surface 340 of the cover plate assembly 112f. The first exhaust passage 376 is angled to extend downward and outward towards the outer surface 316. The first exhaust passage 376 is fluidly connected to a second exhaust passage 378. The second exhaust passage 378 is connected to the first exhaust passage 376 at a distal end of the first exhaust passage 376 furthest from the gas exhaust hole 374.

The second exhaust passage 378 extends horizontally outward from the second exhaust passage 378 towards the outer surface 316 of the cover plate assembly 112f. The second exhaust passage 378 extends through the cover plate assembly 112f before widening at a dilated exhaust passage 380. The dilated exhaust passage 380 extends between the outer surface 316 and the second exhaust passage 378. The dilated exhaust passage 380 widens as the dilated exhaust passage 380 extends further from the second exhaust passage 378 and towards the outer surface 316. The dilated exhaust passage 380 intersects the outer surface 316 and forms an exhaust opening 372. The exhaust opening 372 enables gas trapped under the substrate 110 to be flowed out from under the substrate 110 through the radially disposed grooves 352, the gas exhaust holes 374, and out the exhaust openings 372. The exhaust opening 372 is wider adjacent the outer surface 316 to reduce back pressure within the first and second exhaust passages 376, 378.

Figure 3L:
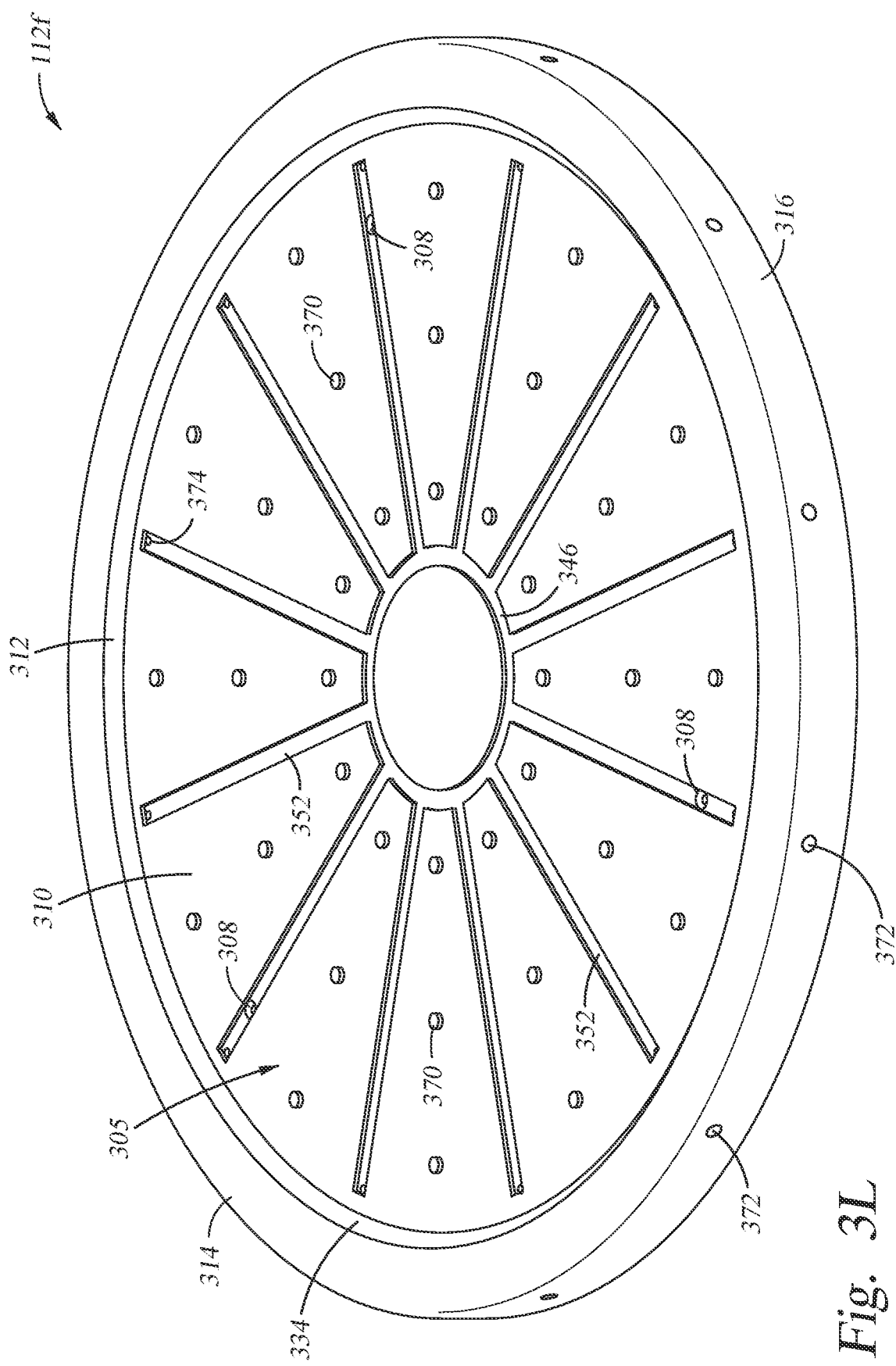
FIG. 3L is a front isometric top view of the sixth embodiment of the cover plate assembly, according to embodiments of the disclosure.

FIG. 3L is a front isometric top view of the sixth embodiment of the cover plate assembly 112f. A plurality of exhaust openings 372 are disposed through the outer surface 316 of the cover plate assembly 112f, such that there are a plurality of radially disposed grooves 352 and a plurality of gas exhaust holes 374.

At least some of the additional radially disposed grooves 352 intersect the lift pin holes 308, such that the radially disposed grooves 352 are in fluid communication with the lift pin holes 308. Each of the radially disposed grooves 352 intersect the annular inner groove 346, such that the annular inner groove 346 connects all of the radially disposed grooves 352. In embodiments described herein, there are 3 to 20 radially disposed grooves 352, such as 6 to 18 radially disposed grooves 352, such as 12 to 18 radially disposed grooves 352. The radially disposed grooves 352 intersect the lift pin holes 308 and allow backside gas disposed underneath the cover plate assembly 112*f* to be flown through the radially disposed grooves 352 and behind the substrate 110.

As shown herein, there are one to five projections 370 disposed between each set of adjacent radially disposed grooves 352, such as two to three projections 370. The number and distribution of the projections 370 enables the substrate 110 to be evenly heated by contacting portions of the substrate receiving surface 310.

Figure 4:
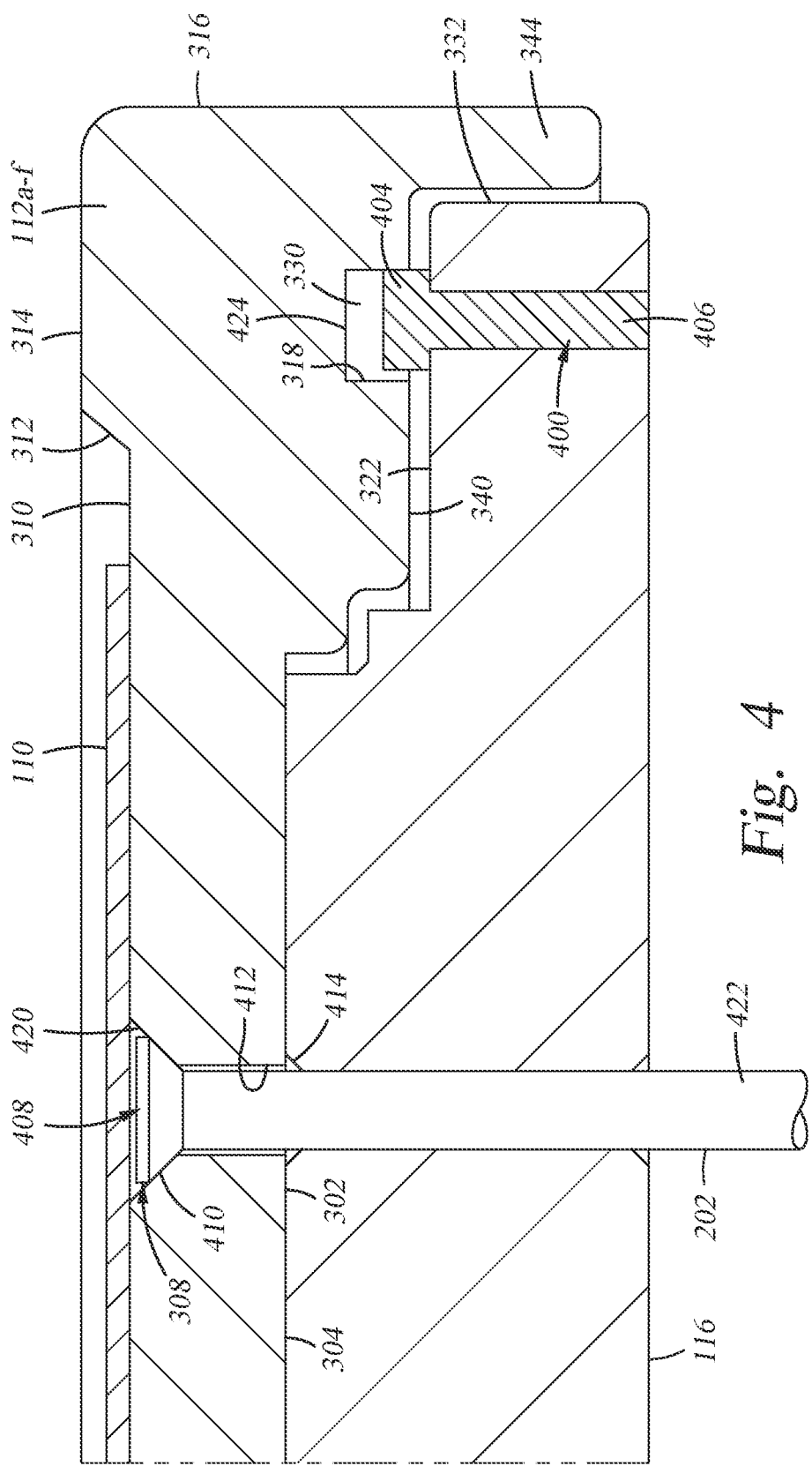
FIG. 4 is an enlarged cross sectional view of a lift pin hole formed through the cover plate assembly and a pin slot formed through the cover plate assembly, according to embodiments of the disclosure.

FIG. 4 is an enlarged cross sectional view of a lift pin hole 308 formed through the cover plate assembly and a pin slot 330 formed through the cover plate assembly. The lift pin hole 308 includes a lift pin 202 disposed therein. The pin slot 330 includes a securing pin 400 disposed therein.

FIG. 4 is representative of the embodiment described in FIGS. 3G and 3H. FIG. 4 also represents elements combinable with other embodiments disclosed herein, such as the embodiments disclosed in FIGS. 3A-3F, 3I-3C, and FIGS. 5A-5D. The lift pin hole 308 and the pin slot 330 may be disposed in any one of the embodiments described herein. In some embodiments, one of either the lift pin hole 308 and the pin slot 330 is utilized.

The lift pin hole 308 includes a slanted upper bore 420. The slanted upper bore 420 is a hole formed in the surface of the substrate receiving surface 310. The slanted upper bore 420 is slanted such that the slanted upper bore 420 narrows as the slanted upper bore 420 goes further from the substrate receiving surface 310. The bottom end of the slanted upper bore 420 is connected to the lower hole surface 412. The lower hole surface 412 is a vertical surface, such that the lower hole surface 412 forms a cylindrical shape. The lower hole surface 412 extends from the bottom of the slanted upper bore 420 to the heater interface surface 304, such that the lower hole surface 412 and the slanted upper bore 420 form a passage through the cover plate assemblies 112*a-d*. The lift pin holes 308 are disposed above and aligned with the heater lift pin holes 414 of the heated substrate support 116. The upper portion of the slanted upper bore 420 adjacent to the substrate receiving surface 310 has an inner diameter of about 3 mm to about 6 mm, such as about 4 mm to about 5 mm, such as about 4.25 mm to about 4.75 mm. The lower hole surface 412 includes an inner diameter of about 2 mm to about 5 mm, such as about 3 mm to about 4 mm, such as about 3.25 mm to about 3.75 mm. The inner diameter of the lower hole surface 412 is the same as the inner diameter of the bottom of the slanted upper bore 420.

The lift pins 202 include an upper head 408 and a cylindrical shaft 422. The upper head 408 includes a slanted head surface 410. The slanted head surface 410 is parallel to the slanted upper bore 420 of the lift pin holes 308. The cylindrical shaft 422 is attached to the bottom of the upper head 408 and extends downwards through the cover plate assembly 112*a-d* and the heated substrate support 116.

The pin slots 330 are formed on the bottom surface 340 of the cover plate assemblies 112*a-d*. The pin slots 330 include sidewalls 318 and a top wall 424. The sidewalls are disposed from the bottom surface 340 inward, such that the sidewalls 318 extend upwards. The sidewalls 318 are vertical sidewalls and may have a cylindrical shape, such that there is a single sidewall 318. The sidewalls 318 extend inwards of the cover plate assembly 112*a-d* and end at the top wall 424. The top wall 424 is the top surface of the pin slots 330 and may be a horizontal surface.

The pin slots 330 are shaped to engage a preexisting piece of the heated substrate support 116, such as the securing pin 400. The securing pin 400 includes a pin head 404 and a pin body 406. The pin head 404 is the portion of the securing pin 400 disposed above the outer top surface 322 of the heated substrate support 116. The pin head 404 may have a cylindrical shape, but other shapes are also contemplated. The pin body 406 is the portion of the securing pin 400 extended into the heated substrate support 116, and may secure components of the heated substrate support 116 to one another. The pin body 406 may have a cylindrical shape, but may additionally have other suitable shapes. The pin body 406 may have a smaller outer diameter than the pin head 404. In some embodiments, the pin slots 330 have an inner diameter of about 3 mm to about 7 mm, such as about 4 mm to about 6 mm, such as about 4.5 mm to about 5.5 mm.

In embodiments in which the securing pin 400 has a non-cylindrical pin head 404, the sidewalls 318 of the pin slots 330 may also have a non-cylindrical shape, such that if the securing pin 400 is shaped as an octagonal prism, the sidewalls 318 may also be shaped as an octagonal prism. If the securing pin 400 is shaped as a hexagonal prism, the sidewalls 318 may also be shaped as a hexagonal prism. If the securing pin 400 is shaped as a rectangular prism, the sidewalls 318 may also be shaped as a rectangular prism.

There may be a plurality of lift pin holes 308 and pin slots 330 within the cover plate assembly 112*a-d*. In some embodiments, the number of lift pin holes 308 equals the number of pin slots 330. The number of lift pin holes 308 may be three lift pin holes. In some embodiments, there may be other numbers of lift pin holes utilized. In some embodiments, the number of pin slots 330 formed in the cover plate assembly 112*a-d* is 2-10 pin slots 330, such as three to six pin slots 330. In some embodiments there are three pin slots 330. In some embodiments, lift pin holes 308 and the pin slots 330 may be radially aligned along the cover plate assembly 112*a-d*. Each of the pin slots 330 are evenly distributed around the center of the heater interface surface.

Figure 5A:
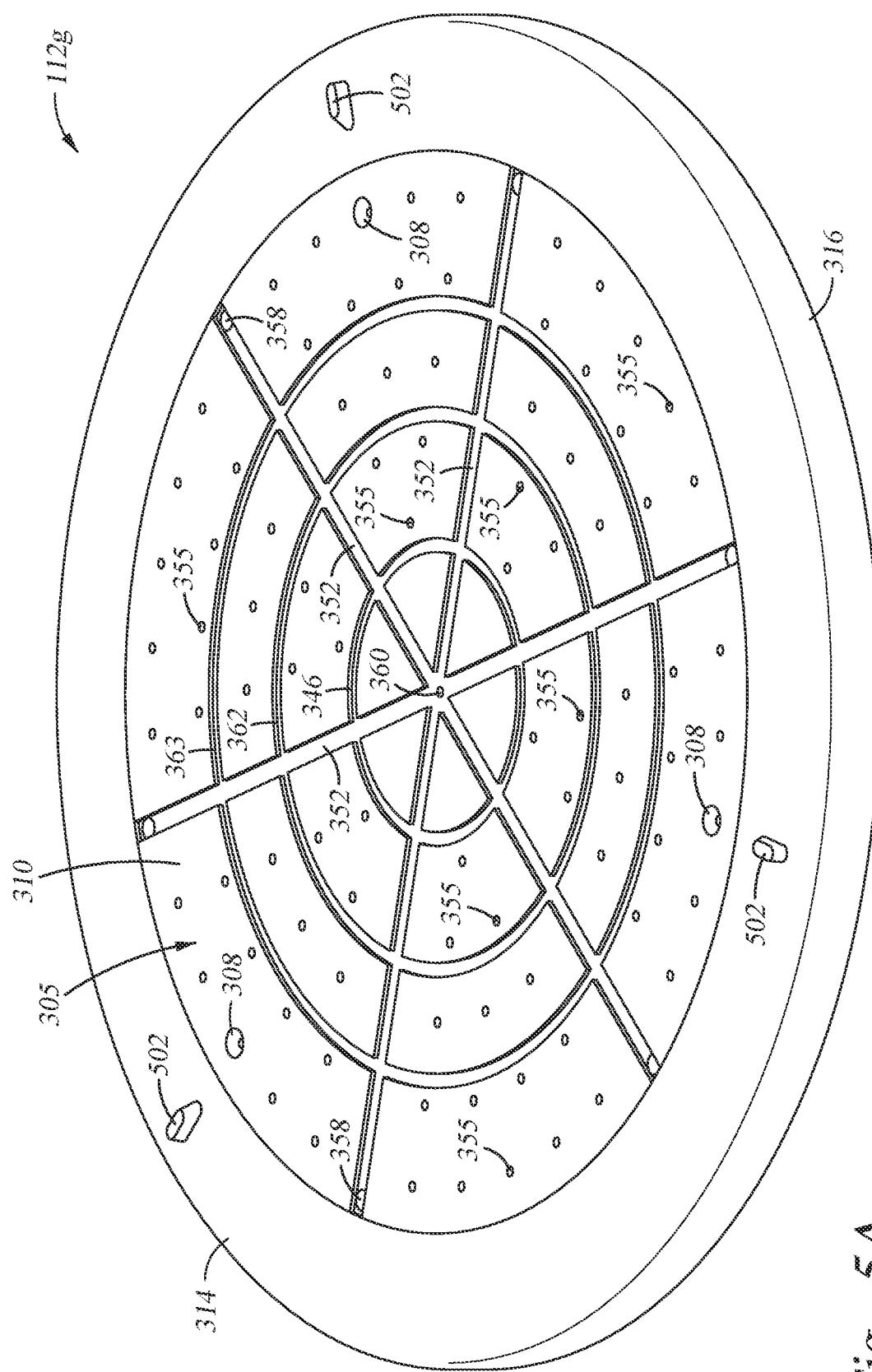
FIG. 5A is a front isometric top view of a seventh embodiment of the cover plate assembly, according to embodiments of the disclosure.

FIG. 5A is a front isometric top view of a seventh embodiment of the cover plate assembly 112*g*. The cover plate assembly 112*g* of the seventh embodiment includes lift pin holes 308, the substrate receiving surface 310, the top surface 314, the overhang portion 348 (Shown in FIGS. 3C, 3E, 3G, and 5B), the outer surface 316, the plurality of dimples 355, the radially disposed grooves 352, the gas exhaust holes 358, the gas supply hole 360, the annular inner groove 346, the annular middle groove 362, and the annular outer groove 363. The lift pin holes 308, the overhang portion 348 (Shown in FIGS. 3C, 3E, 3G, and 5B), the outer surface 316, the plurality of dimples 355, the radially disposed grooves 352, the gas exhaust holes 358, the gas supply hole 360, the annular inner groove 346, the annular middle groove 362, and the annular outer groove 363 are the same as those described in FIGS. 3G and 3H.

In the seventh embodiment of the cover plate assembly 112*g* shown in FIG. 5A, the substrate receiving surface 310 is co-planar with the top surface 314. The co-planarity of the substrate receiving surface 310 and the top surface 314 eliminates the slanted top surface 312 and the outer receiving surface 361 of FIGS. 3G and 3H. The cover plate assembly 112*g* further include a plurality of protrusions 502 on the top surface 314. The pocket 305 of the cover plate assembly 112*g* is defined as the area radially inwards of the protrusions 502, as the protrusions may facilitate securing of a substrate. The pocket 305 includes all of the substrate receiving surface 310 as well as an inner portion of the top surface 314.

The substrate receiving surface 310 and the top surface 314 are co-planar with one another in the cover plate assembly 112g. In the seventh embodiment, the radially disposed grooves 352 extend fully to the edge of the substrate receiving surface 310. The inner edge of the top surface 314 is connected to outer edge of the substrate receiving surface 310 of the cover plate assembly 112g, such that the top surface 314 extends outwards from the substrate receiving surface 310. The top surface 314 and the substrate receiving surface 310 have similar size, shape, and features as disclosed in previous embodiments.

The protrusions 502 are disposed on the top surface 314 of the cover plate assembly 112g. Each of the protrusions 502 are positioned at an equal distance from the center of the cover plate assembly 112g. Each of the protrusions 502 are spaced at an equal angular distance from each other protrusion 502. There may be 3 to 10 protrusions 502 disposed on the top surface 314. In some embodiments there are 3 to 6 protrusions 502, such as 3 to 5 protrusions. In the embodiment shown in FIG. 5A, there are three protrusions 502 disposed on the top surface 314 of the cover plate assembly 112g. The protrusions 502 are radially aligned with the lift pin holes 308, such that the protrusions 502 may also be aligned with the pin slots 330 (FIG. 5B).

The protrusions are disposed at a distance of about 150 mm to about 160 mm from the center of the cover plate assembly 112g, such as about 151 mm to about 155 mm, such as about 152 mm to about 153 mm from the center of the cover plate assembly 112g.

FIG. 5B is a cross sectional view of the seventh embodiment of the cover plate assembly 112g. The cross sectional view of the cover plate assembly 112g illustrates the locations of the substrate receiving surface 310, the protrusions 502, the gas supply hole 360, the lift pin holes 308, the heater interface surface 304, the protrusion 502, the top surface 314, the overhang portion 348, and the pin slots 330. The substrate receiving surface 310, the gas supply hole 360, the lift pin holes 308, the heater interface surface 304, the protrusion 502, the top surface 314, the overhang portion 348, and the pin slots 330 are similar to similarly numbered elements disclosed in previous embodiments. The protrusions 502 are disposed radially outward of the heater interface surface 304.

The protrusion includes an outer protrusion surface 506, a top protrusion surface 507, and an inner protrusion surface 508. The outer protrusion surface 506 is a slanted surface, such that the slope of the outer protrusion surface 506 is positive as the radius of the cover plate assembly 112g decreases. The outer protrusion surface 506 is disposed between the top surface 314 of the cover plate assembly 112g and the top protrusion surface 507, such that the outer protrusion surface 506 connects the top surface 314 to the top protrusion surface 507.

The top protrusion surface 507 is a surface disposed between the outer protrusion surface 506 and the inner protrusion surface 508. The top protrusion surface 507 is shown as a horizontal surface, such that the top protrusion surface 507 is parallel to the substrate receiving surface 310 and the top surface 314. The top protrusion surface 507 connects the outer protrusion surface 506 and the inner protrusion surface 508.

The inner protrusion surface 508 is disposed between the top protrusion surface 507 and the top surface 314 of the cover plate assembly 112g. The inner protrusion surface 508 is a slanted surface, such that the slope of the inner protrusion surface 508 is negative as the radius of the cover plate assembly 112g decreases. The slope of the inner protrusion surface 508 is less than the slope of the outer protrusion surface 506. In some embodiments, the inner protrusion surface 508 is slanted at an angle of about 30 degrees to about 60 degrees, such as about 35 degrees to about 55 degrees, such as about 40 degrees to about 50 degrees, such as about 45 degrees. The inner protrusion surface 508 facilitates seating of a substrate by acting as a guide.

In some embodiments, either of the inner protrusion surface 508 or the outer protrusion surface 506 may be vertical surfaces. The top protrusion surface 507 may alternatively be a slanted surface, such that the top protrusion surface 507 has either a positive or a negative slope.

FIG. 5C is an enlarged plan view of a protrusion 502 formed on the seventh embodiment of the cover plate assembly 112g. The protrusion 502 includes a length 510 and a width 504. The length 510 of the protrusion 502 is greater than the width 504 of the protrusion 502. The length 510 is the distance from the most radially inward part of the protrusion 502 to the most radially outward part of the protrusion 502, such that the length 510 is from where the inner protrusion surface 508 intersects the top surface 314 of the cover plate assembly 112g to where the outer protrusion surface 506 intersects the top surface 314 of the cover plate assembly 112g. In some embodiments, the length 510 of the protrusion 502 is about 6 mm to about 10 mm, such as about 7 mm to about 9 mm, such as about 7.5 mm to about 8.5 mm. The width 504 of the protrusion 502 is the circumferential length of the protrusion 502. In some embodiments, the width 504 of the protrusion 502 is about 2 mm to about 4 mm, such as about 2.5 mm to about 3.5 mm, such as about 2.75 mm to about 3.25 mm.

FIG. 5D is an enlarged cross sectional view of a protrusion 502 formed on the seventh embodiment of the cover plate assembly 112g. The protrusion 502 further includes a height 512. The height 512 is the distance from the top surface 314 of the cover plate assembly 112g to the point on the top protrusion surface 507 furthest from the top surface 314 of the cover plate assembly 112g. In some embodiments, the height 512 of the protrusion 502 is about 0.5 mm to about 2.5 mm, such as about 1 mm to about 2 mm, such as about 1.25 mm to about 1.75 mm.

The cover plate assembly 112g enables for a substrate to be deposited within the pocket 305 with a minimum outer surface. The protrusions 502 act to center the substrate within the pocket 305, but have reduced interaction with the edges of the substrate. Reduced interaction of the protrusions 502, and the slanted top surfaces 312 of the previous embodiments of the cover plate assemblies 112a-d, reduces thermal losses as well as wear on the substrate edges.

Embodiments of the cover plate assembly 112a-e disclosed herein improve thermal uniformity distributed to a substrate. Previously, substrates, such as the substrate 110, were placed directly on the heated substrate support 116. Placing the substrate on the heated substrate support 116 during substrate processing produces low temperature uniformity across the heated substrate support 116 and induces frequent repairs and maintenance of the heated substrate support 116 due to particle deposition on the heated substrate support 116. The cover plate assembly 112a-e improves temperature uniformity by spreading heat load from local hot and cold spots, is easily recycled, is easily replaced, and reduces sliding of the substrate during processing. Features such as the dimples, 355, the radially disposed grooves 352, the gas exhaust holes 358, the gas supply hole 360, the annular inner groove 346, the annular middle groove 362, and the annular outer groove 363 further improve temperature uniformity and reduce sliding of the substrate over the cover plate assembly 112a-e.

While the foregoing is directed to embodiments of the present disclosure, other and further embodiments of the disclosure may be devised without departing from the basic scope thereof, and the scope thereof is determined by the claims that follow.

What is claimed is:

1. A cover plate for substrate processing comprising:
    an annular body, the annular body further comprising:
        a planar substrate receiving surface;
        a heater interface surface parallel to the planar substrate receiving surface;
        a plurality of lift pin holes formed through the annular body;
        an outer top surface disposed radially outward of the planar substrate receiving surface;
        an outer surface extending vertically from the outer top surface;
        a bottom surface disposed radially outward from the heater interface surface;
        an inner overhang surface extending vertically downward from an outer surface of the bottom surface;
        a bottom overhang surface disposed between the outer surface and the inner overhang surface; and
        an annular stepped region between the heater interface surface and the bottom surface, the annular stepped region further comprising:
            a first annular step disposed radially outward from an outer surface of the heater interface surface;
            a second annular step disposed radially outward from the first annular step; and
            an intermediate surface connecting the first annular step and the second annular step.

2. The cover plate of claim 1, wherein the cover plate comprises a ceramic material.

3. The cover plate of claim 2, further comprising a plurality of pin slots extending from the bottom surface into the cover plate.

4. The cover plate of claim 3, wherein the pin slots are about 3 mm to about 7 mm in diameter.

5. The cover plate of claim 3, wherein the plurality of pin slots are radially aligned with the plurality of lift pin holes with respect to a center of the cover plate.

6. The cover plate of claim 1, wherein the outer top surface is vertically offset from the planar substrate receiving surface by a distance of about 0 millimeters to about 6 millimeters.

7. The cover plate of claim 1, further comprising a plurality of radially disposed grooves within the planar substrate receiving surface.

8. The cover plate of claim 7, further comprising at least one annular groove disposed around a central axis of the cover plate and connected to the plurality of radially disposed grooves.

9. The cover plate of claim 1, further comprising a plurality of projections disposed on the substrate receiving surface.

10. The cover plate of claim 9, wherein the projections have a height of about 0.0025 millimeters to about 0.25 millimeters.

11. The cover plate of claim 1, wherein the outer top surface is disposed above the substrate receiving surface and a slanted surface connects the substrate receiving surface and the outer top surface.

12. A cover plate for substrate processing comprising:
    an annular body, the annular body further comprising:
        a substrate receiving surface;
        a heater interface surface parallel to the substrate receiving surface;
        a plurality of lift pin holes formed through the annular body;
        a top surface disposed radially outward of the substrate receiving surface;
        an outer surface extending vertically from the top surface;
        a bottom surface disposed radially outward from the heater interface surface;
        an inner overhang surface extending vertically downward from an outer surface of the bottom surface;
        a bottom overhang surface disposed between the outer surface and the inner overhang surface;
        an annular stepped region disposed between the heater interface surface and the bottom surface and extending outward and away from the top surface, such that the annular stepped region is oriented towards the bottom overhang surface; and
        a plurality of pin slots extending from the bottom surface into the cover plate.

13. The cover plate of claim 12, further comprising a plurality of radially disposed grooves disposed within the substrate receiving surface.

14. The cover plate of claim 13, further comprising a plurality of gas exhaust holes formed through the cover plate at an outermost radial position of each of the plurality of radially disposed grooves.

15. The cover plate of claim 14, further comprising a plurality of exhaust passages extending radially outward from the plurality of gas exhaust holes.

16. The cover plate of claim 12, wherein the substrate receiving surface is vertically offset from the top surface by about 0.0025 mm to about 0.25 mm.

17. An assembly for supporting a substrate comprising:
    a heated substrate support;
    a plurality of lift pins;
    a securing pin disposed along an outer surface of the heated substrate support; and
    an annular cover plate disposed on top of and covering an upper surface of the heated substrate support, the annular cover plate further comprising:
        a substrate receiving surface;
        a heater interface surface parallel to the substrate receiving surface;
        a plurality of lift pin holes formed through the annular cover plate;
        a top surface disposed radially outward of the substrate receiving surface;
        a bottom surface disposed radially outward from the heater interface surface; and
        a plurality of pin slots extending from the bottom surface into the annular cover plate.

18. The assembly of claim 17, wherein the annular cover plate further comprises:
    an outer surface extending vertically from the top surface;
    an inner overhang surface extending vertically downward from an outer surface of the bottom surface; and a bottom overhang surface, disposed between the outer surface and the inner overhang surface.

* * * * *